United States Patent
Mazurkiewicz

(10) Patent No.: US 6,596,937 B2
(45) Date of Patent: Jul. 22, 2003

(54) BOARD-LEVEL CONFORMAL EMI SHIELD HAVING AN ELECTRICALLY-CONDUCTIVE POLYMER COATING OVER A THERMALLY-CONDUCTIVE DIELECTRIC COATING

(75) Inventor: Paul H. Mazurkiewicz, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 09/974,367

(22) Filed: Oct. 9, 2001

(65) Prior Publication Data

US 2002/0166680 A1 Nov. 14, 2002

Related U.S. Application Data

(63) Continuation-in-part of application No. 09/812,274, filed on Mar. 19, 2001.

(51) Int. Cl.$^7$ .................................................. H05K 5/00
(52) U.S. Cl. ...................... 174/35 R; 361/816; 361/818
(58) Field of Search .......................... 174/35 R, 35 GC, 174/35 MS; 361/800, 816, 818

(56) References Cited

U.S. PATENT DOCUMENTS

| | | | | |
|---|---|---|---|---|
| 4,474,685 A | * | 10/1984 | Annis ......................... | 252/503 |
| 4,883,730 A | * | 11/1989 | Ahne et al. ................. | 430/18 |
| 5,394,304 A | * | 2/1995 | Jones ......................... | 361/765 |
| 5,696,196 A | * | 12/1997 | DiLeo ........................ | 524/445 |
| 5,703,761 A | * | 12/1997 | Heiss ......................... | 361/800 |
| 5,918,152 A | * | 6/1999 | Erzhuang et al. ........... | 438/782 |
| 5,968,600 A | * | 10/1999 | DiLeo ........................ | 427/393.5 |
| 6,046,652 A | * | 4/2000 | Deiso et al. ................. | 333/12 |
| 6,218,610 B1 | * | 4/2001 | Suzuki ....................... | 174/35 R |

OTHER PUBLICATIONS

ConQuest General Information Bulletin, DSM Research New Business Development, DSM N.V. Company Netherlands, pp. 1–12. No Date.
Product Data Sheet, ConQuest XP1020, DSM Research New Business Development, 2 pp., DSM N.V. Company Netherlands, Aug. 4, 1999.
Product Data Sheet, ConQuest XP1000, DSM Research New Business Development, 2 pp., DSM N.V. Company Netherlands, Aug. 4, 1999.
Product Data Sheet, ConQuest XP1100UV, DSM Research New Business Development, 2 pp., DSM N.V. Company Netherlands, Aug. 4, 1999.
Material Safetly Data Sheet, Shadow cure Conformal Coating 397, Item Nos. 29821A &B, 9 pp., Loctite Corporation, Jul. 1, 2001.
Shadow cure Conformal Coating Product Brochure, 2 pp., Loctite Corporation. No Date.

* cited by examiner

Primary Examiner—Dean A. Reichard
Assistant Examiner—W. David Walkenhorst

(57) ABSTRACT

An electrically continuous conformal EMI protective shield for adhering directly to and conforming with surfaces of a printed circuit board is disclosed. The conformal EMI shield includes a thermally conductive dielectric coating adhering directly to surfaces of the printed circuit board to provide an electrically nonconductive, thermally conductive, contiguous coating that covers all such printed circuit board surfaces. The conformal EMI shield also includes a conductive coating adhering directly to surfaces of the dielectric coating to provide an electrically conductive layer that prevents electromagnetic emissions from passing through the conformal EMI protective shield.

15 Claims, 18 Drawing Sheets

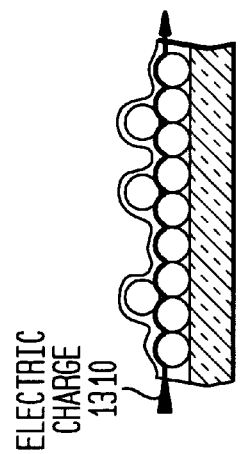
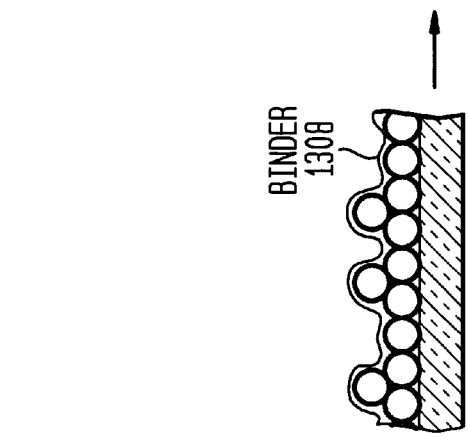
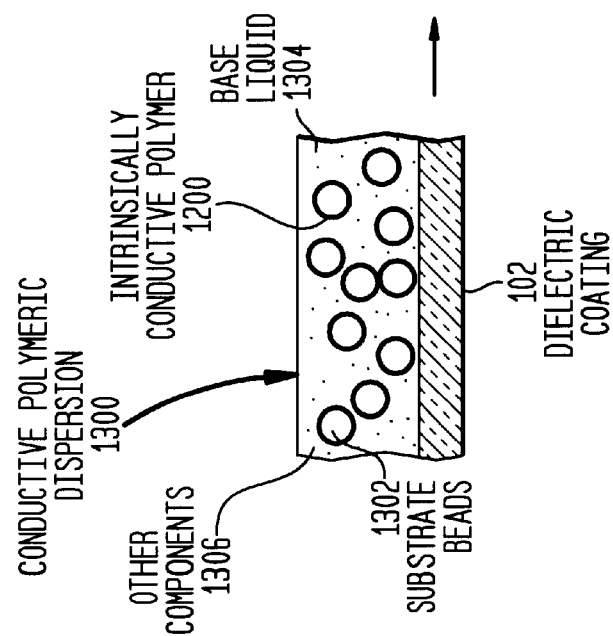

BOARD-LEVEL CONFORMAL EMI SHIELD HAVING AN ELECTRICALLY-CONDUCTIVE POLYMER COATING OVER A THERMALLY-CONDUCTIVE DIELECTRIC COATING

RELATED APPLICATIONS

The present application is a continuation-in-part application of commonly-owned U.S. patent application Ser. No. 09/812,274 entitled "A BOARD-LEVEL EMI SHIELD THAT ADHERES TO AND CONFORMS WITH PRINTED CIRCUIT BOARD COMPONENT AND BOARD SURFACES," naming as inventors Samuel M. Babb, Lowell E. Kolb, Brian Davis, Jonathan P. Mankin, Kristina L. Mann, Paul H. Mazurkiewicz and Marvin Wahlen, filed on Mar. 19, 2001 and now pending.

The present application is related to the following commonly-owned U.S. patent applications:

U.S. patent application Ser. No. 09/813,257 entitled "FILLER MATERIAL AND PRETREATMENT OF PRINTED CIRCUIT BOARD COMPONENTS TO FACILITATE APPLICATION OF A CONFORMAL EMI SHIELD," naming as inventor Lowell E. Kolb and filed on Mar. 19, 2001; and U.S. patent application Ser. No. 09/812,662 entitled "A LOW PROFILE NON-ELECTRICALLY-CONDUCTIVE COMPONENT COVER FOR ENCASING CIRCUIT BOARD COMPONENTS TO PREVENT DIRECT CONTACT OF A CONFORMAL EMI SHIELD," naming as inventor Lowell E. Kolb and filed on Mar. 19, 2001.

BACKGROUND OF THE INVENTION

1. Field of the Invention

The present invention relates generally to electromagnetic interference (EMI) protective measures and, more particularly, EMI protective measures for printed circuit boards.

2. Related Art

Most countries have regulations that limit the amount of electromagnetic emissions that electromagnetic equipment may produce. Electromagnetic emissions are the unwanted byproduct of high-frequency electronic signals necessary, for example, to operate an electronic microprocessor or other logic circuitry. The resulting electromagnetic interference (EMI) is problematic when it interferes with licensed communications such as television, radio, air communications and navigation, safety and emergency radios, etc. This type of interference has historically been known as radio-frequency interference (RFI). See CFR 47 part 15 and ANSI publication C63.4-1992 for regulations in the United States, or CISPR publication 11 or 22 for international regulations. Also, "Noise Reduction Techniques in Electronic Systems" by Henry W. Ott, serves as a comprehensive reference on the current art for the control of EMI, and the broader topic known as electromagnetic compatibility (EMC).

To meet EMI regulations, most electronic equipment currently employs a combination of two approaches commonly referred to as "source suppression" and "containment." Source suppression attempts to design components and subsystems such that only essential signals are present at signal interconnections, and that all non-essential radio frequency (RF) energy is either not generated or attenuated before it leaves the component subsystem. Containment attempts have traditionally included placing a barrier around the assembled components, subsystems, interconnections, etc., to retain unwanted electromagnetic energy within the boundaries of the product where it is harmlessly dissipated.

This latter approach, containment, is based on a principle first identified by Michael Faraday (1791–1867), that a perfectly conducting box completely enclosing a source of electromagnetic emissions prevents those emissions from leaving the boundaries of the box. This principle is employed in shielded cables as well as in conventional shielded enclosures. Conventional shielded enclosures are typically implemented as a metal box or cabinet that encloses the equipment. The metal box is commonly referred to as a metallic cage and is often supplemented with additional features in an attempt to prevent RF energy from escaping via the power cord and other interconnecting cables. For example, a product enclosure might consist of a plastic structure with a conductive coating on the surface. This approach is commonly implemented in, for example, cell phones. More commonly, the metal enclosure is implemented as a metal cage located inside the product enclosure. Since the EMI suppression necessary for the entire product or system requires that only a portion of the product be shielded, such metallic cages are commonly placed around selected components or subsystems.

There are numerous drawbacks to the use of such metallic cages primarily relating to the lack of shielding effectiveness. Electromagnetic energy often escapes the metallic cage at gaps between the metallic cage and the printed circuit board. Electrical gaskets and spring clips have been developed to minimize such leakage. Unfortunately, such approaches have only limited success at shielding while increasing the cost and complexity of the printed circuit board. In addition, leakage occurs because the cables and wires penetrating the metallic cage are not properly bonded or filtered as they exit the metallic cage. In addition, the metallic cage creates a stagnant buffer of insulating air around the enclosed component or subsystem causing the temperature of the shielded component or subsystem to increase. In such products, the enclosure typically includes cooling apertures and fans to circulate air around the metallic cage to dissipate the heat. Further drawbacks of metallic cages include the added cost and weight to the printed circuit board assembly, as well as the limitations such metallic cages place on the package design.

SUMMARY OF THE INVENTION

In one aspect of the invention an electrically continuous conformal EMI protective shield for adhering directly to and conforming with surfaces of a printed circuit board is disclosed. The conformal EMI shield comprises a thermally conductive dielectric coating adhering directly to surfaces of the printed circuit board to provide an electrically nonconductive, thermally conductive, contiguous coating that covers all such printed circuit board surfaces. The conformal EMI shield also comprises a conductive coating adhering directly to surfaces of the dielectric coating to provide an electrically conductive layer that prevents electromagnetic emissions from passing through the conformal EMI protective shield.

In another aspect of the invention, a printed circuit board (PCB) is disclosed. The PCB comprises a printed wiring board, a plurality of components mounted on the printed wiring board, and a conformal coating secured to surfaces of the PCB. The conformal coating comprises a conductive coating, conformingly and adheringly disposed on the PCB surfaces, that prevents electromagnetic waves from passing therethrough. The conformal coating also comprises a thermally conductive dielectric coating interposed between the conductive coating and predetermined portions of the PCB surfaces so as to completely insulate the predetermined PCB portions from current traveling through the conductive coating.

In a further aspect of the invention, a method for coating a printed circuit board is disclosed. The method comprises the steps of providing a printed circuit board; and conformingly adhering to the printed circuit board a continuous conformal coating for providing a substantially EMI-impervious shield. The continuous conformal coating comprises a thermally conductive dielectric coating and a contiguous conductive coating. The thermally conductive dielectric coating adheres directly to surfaces of the printed circuit board to provide an electrically nonconductive, contiguous layer over all such printed circuit board surfaces. The conductive coating adheres directly to surfaces of the dielectric coating to provide an electrically conductive layer that prevents electromagnetic emissions from passing through the conformal EMI protective shield.

BRIEF DESCRIPTION OF THE DRAWINGS

Further features and advantages of the present invention as well as the structure and operation of various embodiments of the present invention are described in detail below with reference to the accompanying drawings. In the drawings, like reference numerals indicate identical or functionally similar elements. Additionally, the left most one or two digits of a reference numeral identify the drawing in which the reference numeral first appears. This description is given by way of example only and in no way restricts the scope of the invention. A brief description of the figures follows.

FIGS. 8E-1 is a cross-sectional view of the component cover shown in FIG. 8A illustrating one embodiment of a line or severability in the form of a crease.

FIGS. 8E-2 is a cross-sectional view of the component cover shown in FIG. 8A illustrating an alternative embodiment of a line or severability.

FIG. 13 includes three figures, FIGS. 13A, 13B and 13C.

FIG. 13A illustrates the state of one embodiment of the conductive polymeric dispersion when applied to the surface of a printed wiring board or component mounted thereon.

FIG. 13B illustrates the state of the embodiment of the conductive polymeric dispersion illustrated in FIG. 13A after curing to form an electrically conductive polymeric coating adhered to the surface of the printed wiring board or component to which it was applied.

FIG. 13C is an illustration of the conductive polymeric dispersion of FIG. 13B in operation conducting electricity across the surface of the printed wiring board or component to which it was applied.

FIG. 15 includes two figures, FIGS. 15A and 15B.

DETAILED DESCRIPTION

1. Introduction

Figure 1:
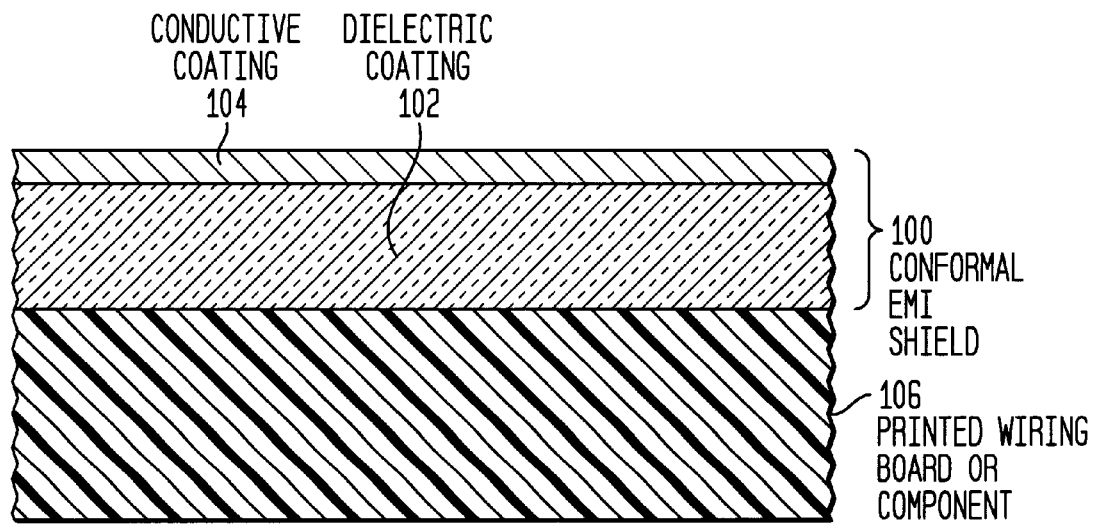
FIG. 1 is a cross-sectional view of one aspect of the conformal EMI shield of the present invention illustrating its conductive and dielectric coatings.

The present invention is directed to an electrically continuous, grounded conformal electromagnetic interference (EMI) protective shield, methods for applying the same directly to the surfaces of a printed circuit board, and a printed circuit board coated with such a conformal EMI shield. The conformal EMI shield of the present invention adheres to and conforms with the surface of the components and printed wiring board to which it is applied. Because the conformal EMI shield is relatively thin, the conformal EMI shield takes the shape of the covered components without changing significantly the dimensions of the printed circuit board region to which it is applied. The conformal EMI shield of the present invention includes two primary coatings. A conductive coating prevents electromagnetic radiation from passing through the conductive coating, whether generated by the shielded components or emanating from a source not on the printed circuit board. The conformal EMI shield also includes a dielectric coating interposed between the conductive coating and the printed circuit board to prevent the conductive coating from electrically contacting predetermined portions of the coated printed circuit board region.

Advantageously, the conformal EMI shield of the present invention completely and contiguously coats the printed circuit board; that is, there are no substantial gaps, voids or breaks in the conformal EMI shield. Nor are there any gaps, breaks for voids between the conformal shield and the coated surfaces. This enables the conformal EMI shield to provide significantly improved shielding effectiveness as compared with conventional techniques of shielding product enclosures and placing localized shielding boxes over critical components or subassemblies. In contrast to such approaches, there are no opportunities for EMI to penetrate the conformal EMI shield such as the gaps between conventional metallic cages and the printed wiring board, which are often filled with electrical gaskets.

Another advantage of the present invention associated with the contiguous and complete contact between the conformal EMI shield and the coated printed circuit board surfaces is that it does not create a thermal insulation of "dead air" space around the shielded components. In fact, because the conformal EMI shield is a thin, continuous layer that is physically attached to the surfaces of the printed circuit board, it promotes the distribution of heat away from the coated printed circuit board regions rather than serving as a thermal insulator. Specifically, the conformal EMI shield conducts heat away from the component to the surface of the conductive coating where it is either dissipated through convection to the surrounding environment or conducted to a heat sink.

As noted, conventional product enclosures include cooling holes and fans to circulate air around the printed circuit board and metallic EMI boxes. An associated benefit of the present invention is that the size restrictions on the cooling holes and fan grills on the product enclosures is eliminated since there is no longer a need to remove heat emanating from a high temperature metallic EMI box on the printed circuit board.

A further advantage of the present invention is that it eliminates the need for all other types of EMI shielding components. In particular, elimination of conventional metallic EMI boxes reduces the cost and the weight of the sheet metal. This, in turn, eliminates the constraints on package design imposed by such conventional approaches. Furthermore, the associated shielding components such as gaskets and spring contacts are eliminated, reducing the associated cost and complexity.

2. Conformal EMI Shield Materials

A. Overview

Figure 2A:
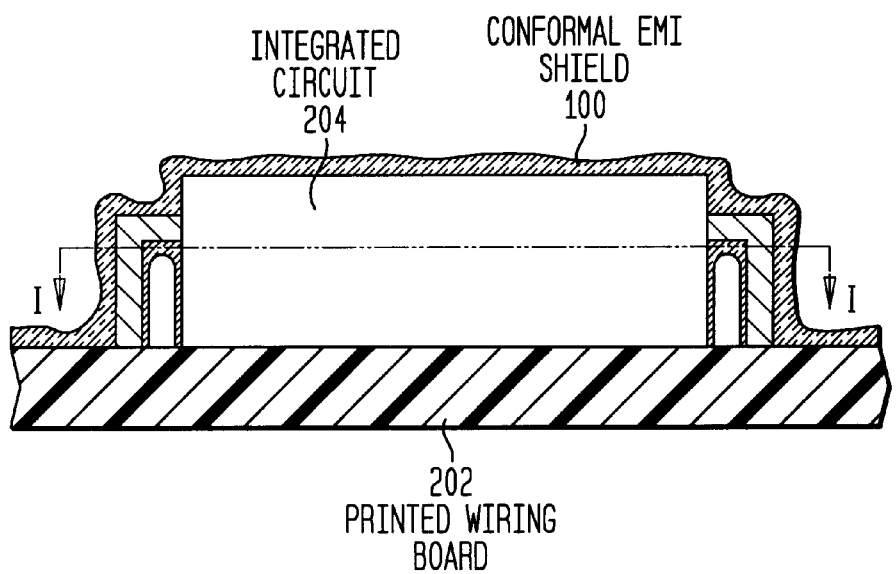
FIG. 2A is a side cross-sectional view of an integrated circuit mounted on a printed wiring board and covered with a conformal EMI shield in accordance with one embodiment of the present invention.
Figure 2B:
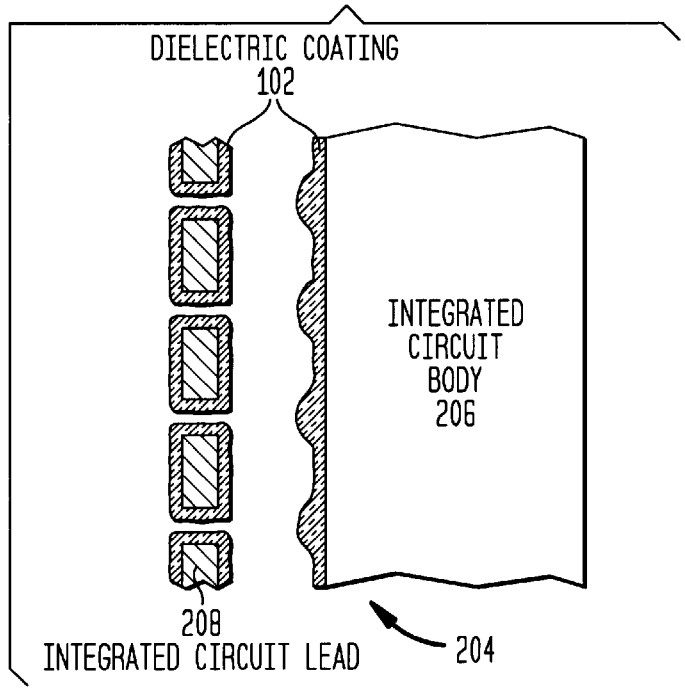
FIG. 2B is a top cross-sectional view of the integrated circuit introduced in FIG. 2A taken along section line I—I, showing only the dielectric coating portion of the conformal EMI shield of the present invention applied to the integrated circuit.
Figure 2C:
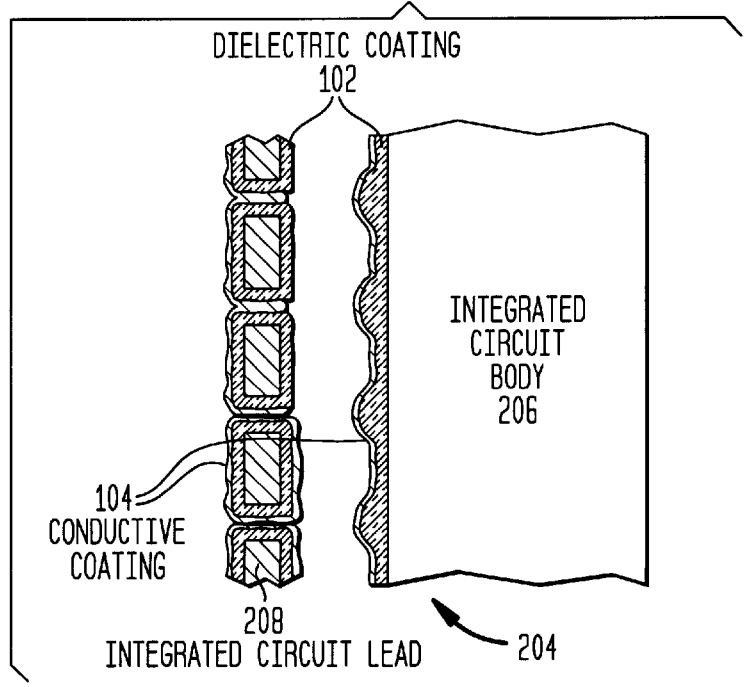
FIG. 2C is a top cross-sectional view of the integrated circuit illustrated in FIG. 2A taken along section line I—I, showing the conductive coating portion of the conformal EMI shield of the present invention applied over the dielectric layer shown in FIG. 2B.

As noted, the conformal EMI shield includes a conductive coating and a dielectric coating permanently bonded to each other. The materials that can be used in the conductive and dielectric coatings are described below with reference to FIGS. 1–3. FIG. 1 is a cross-sectional view of one embodiment of the conformal EMI shield of the present invention. FIG. 2A is a cross-sectional view of an integrated circuit component mounted on a printed wiring board forming a portion of a printed circuit board. The integrated circuit component and printed wiring board have been coated with one embodiment of the conformal EMI shield of the present invention. FIG. 2B is a top view of the integrated circuit component illustrated in FIG. 2A taken along section line I—I illustrating the application of the shield's dielectric coating in accordance with one embodiment of the present invention. FIG. 2C is a top view of the integrated circuit component taken along the same section line illustrating the application of the conformal EMI shield's conductive coating in accordance with one embodiment of the present invention.

Referring now to FIG. 1, this embodiment of EMI shield 100 includes a dielectric coating 102 and a conductive coating 104. The exposed surfaces of selected printed circuit board regions 106 are coated with conformal EMI shield 100. Such surfaces can be, for example, the top, side and, if exposed, bottom surface of a component, the surface of any leads, wires, etc, that are connected to the component, as well as any other exposed surface of any other portions, elements, sections or features (hereinafter "features") of the components and printed wiring board located in the coated printed circuit board region. It should be appreciated that the selection of the combination of material properties for dielectric coating 102 and conductive coating 104 is important to achieving a conformal EMI shield that can be applied directly to printed circuit board surfaces without damaging components and connections, that does not expose the coated regions to risk of electrical shorts, and that completely envelops or encases the coated regions to provide a desired shielding effectiveness. As will be described in detail below, conformal EMI shield 100 not only achieves such operational objectives, but does so, as noted, by directly coating; that is, physically adhering to, the surface of coated printed circuit board regions. This enables conformal EMI shield 100 to completely and conformingly coat the surfaces of the shielded printed circuit board regions.

B. Dielectric Coating

Dielectric coating 102 is comprised of a material that is electrically nonconductive and, preferably, thermally conductive. Importantly, the material properties of dielectric coating 102, described in detail below, enable dielectric coating 102 to completely coat and securely attach to component and board surfaces to which it is applied. Generally, the material properties of dielectric coating 102 include primarily a combination of viscosity and adhesion sufficient to enable dielectric coating 102 to be applied via atomization spray techniques and, once applied, to adhere to the surface in the immediate vicinity of where it was applied. In other words, adhesiveness of dielectric coating 102 is sufficient to prevent dielectric coating 102 from separating from the surface to which it is applied prior to curing, a phenomenon commonly referred to as dewetting. Such a condition will otherwise result in a void in dielectric coating 102, providing the potential of an electrical short in the exposed portion of printed wiring board or component 106. Dielectric coating 102 can comprise multiple, successively applied layers of dielectric material. As such, dielectric material 102 preferably also includes the properties necessary to enable it to adhere to or bond with previously applied dielectric layers.

Specifically and in one embodiment, dielectric coating 102 has a viscosity of at least 45" #2 Zahn Cup (full body). In another embodiment, dielectric coating 102 has a viscosity in the range of 50–100" #2 Zahn Cup (full body). In one preferred embodiment, dielectric coating 102 has a viscosity of 70–95" #2 Zahn Cup (full body). A dielectric coating 102 having any of the above viscosity values can be applied uniformly using a conventional spray atomization technique. This enables dielectric coating 102 to completely access and coat the surfaces of the components and board that are located underneath component leads, between components and wiring board surfaces and other regions that are exposed yet difficult to access. Such features of the printed circuit board are referred to generally herein as cavities. In general, dielectric coating 102 can adhere to the materials utilized in the printed circuit board. Such materials include, but are not limited to, FR-4 such as polymethylmethacrylates, bisphenol-A based epoxy and fiberglass, ceramics such as aluminum oxide and silicon dioxide, silicon, polyimide (silicon wafers), polyethylene (sockets), polyethylene terephthalate, polystyrene (sockets), polyphenylsulfone or PPS (chip sockets), polyvinyl chloride or PVC (wire coverings), silicone rubbers such as RTV (various surfaces), aluminum, gold, stainless steel and low carbon steel), tin, lead, and others. Dielectric coating 102 preferably has an adhesion that enables it to pass the ASTM D-3359-97 Method A Tape Test using a 1" (25 mm wide) semi-transparent pressure-sensitive tape with and adhesion strength of 25–70 and, more preferably, 30–50 ounces per inch when tested in accordance with ASTM Test Method D-3330.

In one embodiment, dielectric coating 102 is comprised primarily of Clear Water Reducible Barner Coat, Formula Number CQW-L200DF, manufactured by The Egyptian Coating Lacquer Manufacturing Company, Franklin, Tenn., USA. CQW-L200DF has a viscosity in the range of 50–60" #2 Zahn Cup (full body) and an adhesion that enables it to pass the ASTM D-3359-97 Method A Tape Test using a 1" (25 mm wide) semi-transparent pressure-sensitive tape with an adhesion strength of 40±2.5, ounces per inch when tested in accordance with ASTM Test Method D-3330. CQW-L200DF provides excellent adhesion to materials commonly found on a printed circuit board comprising, but not limited to, the materials noted above.

Non-electrical-conductive conformal coatings have minimal thermal characteristics due to their low density, molecular properties, etc. Printed circuit boards that are coated with such conformal coatings could, under certain circumstances, overheat. To prevent such occurrences, it is preferred that when used in accordance with the conformal EMI shield 100 of the present invention, dielectric coating 102 is thermally conductive. In accordance with one embodiment of the present invention, dielectric coating 102 is doped or loaded with a non-electrically conductive, dense substance having relatively improved thermal transfer characteristics, referred to herein as a thermal loading material. The resulting dielectric coating 102 is referred to herein as a thermally conductive dielectric coating.

Figure 14:
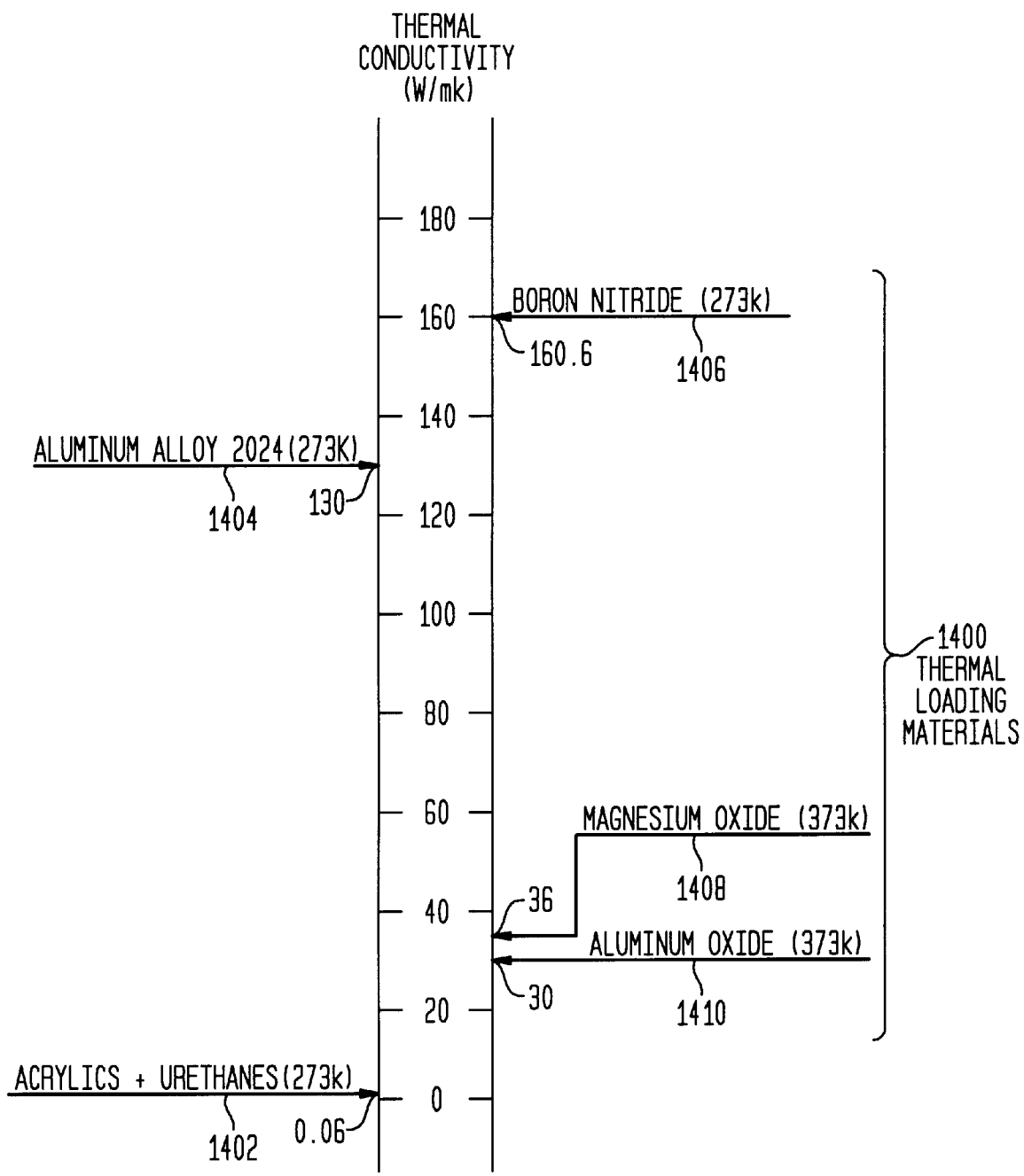
FIG. 14 is a scale illustrating the relative thermal conductivity of acrylics/urethanes, metals and thermal loading materials utilized in one aspect of the present invention.

FIG. 14 is a scale illustrating the relative thermal conductivity of thermal loading materials, polymers and metal conductors. In this illustrative scale, thermal conductivity is presented in units of Watts per millikelvin (W/mK). The vertical column in the middle of the figure sets forth a thermal conductivity scale from 0 through 180 W/mK. On the left-hand side of the scale are insulators such as acrylics and urethanes 1402, and aluminum alloy 2024 (reference numeral 1404). Acrylics and urethanes 1402 have a thermal conductivity of 0.06 W/mK. Aluminum alloy 1404, a popular alloy used in heat sinks, has a thermal conductivity of 130 W/mK.

For ease of comparison, thermal loading materials 1400 are positioned on the right side of the scale. Examples of thermal loading materials 1400 illustrated in FIG. 14 include aluminum oxide ($AlO_3$) 1410, magnesium oxide (MgO) 1408 and boron nitride (BN) 1406. As shown, the conductivity of aluminum oxide 1410 is 30 W/mK while the thermal conductivity of magnesium oxide is 36 W/mK. Both of these materials have a thermal conductivity that is substantially greater than acrylics and urethanes 1402, with a thermal conductivity of 0.06 W/mK. Boron nitride 1406 has a thermal conductivity of 160.6 W/mK, making it a preferred thermal loading materials 1400. As shown, the thermal conductivity of boron nitride 1406 is greater than that of even aluminum alloy 1404, a metal used specifically to conduct heat away from heat-generating components. is It should be understood, however, that in contrast to such metallic materials, boron nitride 1406 is non-electrically conductive, as are all thermal loading materials 1400 as defined herein.

Figure 15B:
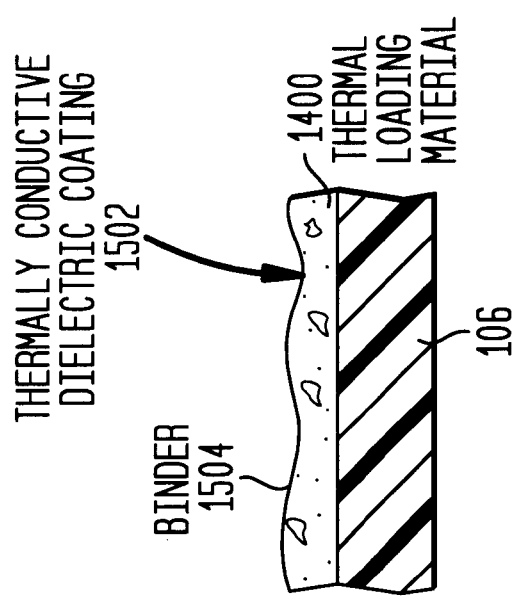
FIG. 15B illustrates the state of the embodiment of the thermally conductive dielectric dispersion of FIG. 15A after curing to form a thermally conductive dielectric coating adhered to the surface of a printed wiring board or component.
Figure 15A:
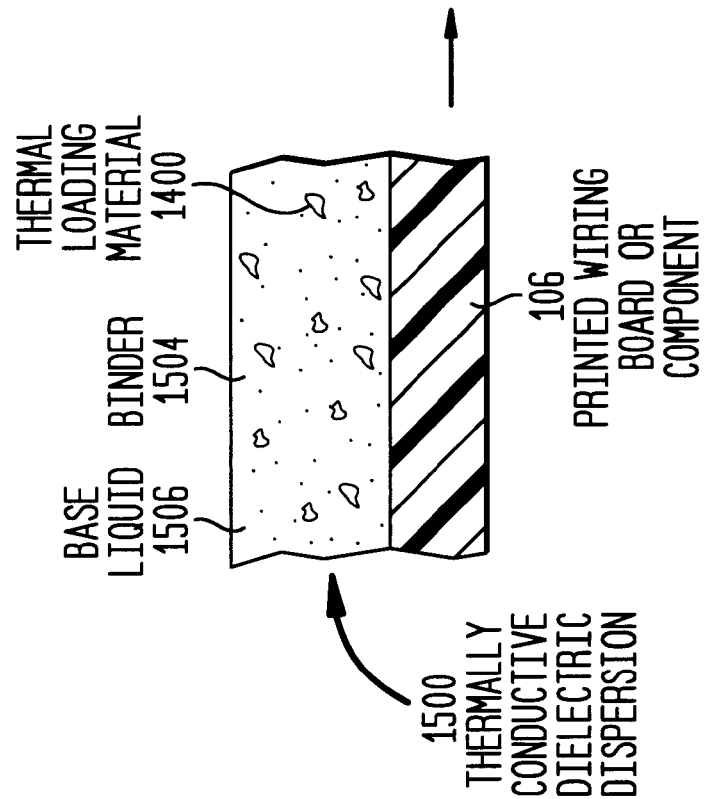
FIG. 15A illustrates the state of one embodiment of the thermally conductive dielectric dispersion when applied to the surface of a printed wiring board or component mounted thereon.

FIG. 15 includes 2 figures illustrating the state of one preferred embodiment of a thermally conductive dielectric dispersion 1500 when applied (FIG. 15A) and cured (FIG. 15B) in accordance with the teachings of the present invention. Once applied and cured, thermally conductive dielectric coating 1502 is a substantially dry, solid coating. However, the state of thermally conductive dielectric coating 1502 prior to when it is applied to the printed circuit board can vary. Preferably, thermally conductive dielectric coating 1502 is applied using conventional spray atomization techniques. To facilitate the implementation of such application techniques, it is preferred that the thermally conductive dielectric coating 1502 is provided in the form of a dispersion, referred to herein as a thermally conductive dielectric dispersion 1500.

In FIG. 15A, thermally conductive dielectric dispersion 1500 is shown after it has been applied to a surface of a printed circuit board or component 106 but before it is cured. In this illustrative embodiment, thermally conductive dielectric dispersion 1500 includes a binder material 1504 and thermal loading material 1500 suspended in a base liquid 1506. Binder material 1504 can be, for example, any well-known and commercially available acrylic or urethane.

As one of ordinary skill in the art would find apparent, thermally conductive dielectric dispersion 1500 is a heterogeneous solution in which thermal loading material 1400 is dispersed in a base liquid 1506 such as water or organic solvent. As the contiguity of the thermal loading material 1400 in the cured dielectric coating 1502 increases, so too does the ability of dielectric coating 1502 to conduct heat. Accordingly, it is preferable that the suspension is substantially uniform to insure the contiguity of the thermal loading material 1400 in the resulting dielectric coating 1502.

With regard to base liquid 1506, waterborne dispersions are preferred because they are substantially easier to process than dispersions using organic solvents. In addition, the use of water eliminates the environmental and processing drawbacks associated with the use of organic solvent emissions. However, organic solvents including, for example, N-Methyl-Pyrolidinone (NMP), various alcohols, acetone, Methyl-Ethyl-Ketone (MEK), and others, may be a suitable base liquid 1506 in certain applications.

In one embodiment, thermally conductive dielectric dispersion 1500 is formed by doping or loading a conformal coating dispersion such as a commercially-available acrylic or urethane dispersion with a thermal loading material 1400. Prior to doping, such acrylic or urethane dispersions are referred to herein as an intermediate dispersion. Such intermediate dispersions have a binder 1504 of either acrylic or urethane, and a base liquid 1506 of water or organic solvents.

In one embodiment, such acrylic intermediate dispersions include, for example, the waterborne LOCTITE® product 394 Shadowcure™ urethane acrylate conformal coating available from the Loctite Corporation, Rocky Hill, Conn., which has a thermal conductivity of approximately 0.16 W/mK when measured in accordance with ASTM F-433. Another acrylic intermediate dispersion is the waterborne LOCTITE® product 397 Shadowcure™ urethane acrylate conformal coating which has an ASTM F-433 thermal conductivity of approximately 2.17 W/mK. These intermediate dispersions serve as excellent dielectrics. For example, at 1 kHz, Product 394 has a dielectric constant & loss of 3.3 and 0.015; at 1 MHz, 2.9 and 0.020, when measured in accordance with ASTM D150. Product 394 has a volume resistivity of $3.8 \times 10^{16}$ ohm-cm and a surface resistivity of $7 \times 10^{16}$ ohms when measured in accordance with ASTM D257. At 1 kHz, product 397 has a dielectric constant & loss of 4.6 and 0.045; at 1 MHz, 3.8 and 0.048, when measured in accordance with ASTM D150. Product 397 has a volume resistivity of $3.17 \times 10^{15}$ ohm-cm and a surface resistivity of $2.36 \times 10^{16}$ ohms when measured in accordance with ASTM D257. The Technical Data Sheets for these two intermediate dispersions can be obtained from Loctite Corporation.

Another embodiment of an acrylic intermediate dispersion suitable for use in the present invention is the waterborne HumiSeal® 1B12 or 1B31 acrylic conformal coatings available from HumiSeal Corporation, Woodside, N.Y. These two products also serve as good dielectrics and can be doped with thermal loading materials 1400. For example, the HumiSeal® 1B12 has a dielectric constant of 2.8 and surface resistivity of $250 \times 10^{12}$ ohms when measured in accordance with ASTM D257. The HumiSeal® 1B31 has a dielectric constant of 2.5 and surface resistivity of $800 \times 10^{12}$ ohms when measured in accordance with ASTM D257. The Technical Data Sheets for these two intermediate dispersions can be obtained from HumiSeal Corporation.

As noted, intermediate dispersions can also have a urethane binder 1504. In one embodiment, such an intermediate dispersion is the above-noted Clear Water Reducible Barrier Coat, Formula Number CQW-L200DF, manufactured by The Egyptian Coating Lacquer Manufacturing Company. This intermediate dispersion has a water base liquid 1506 and a urethane binder 1504. The Technical Data Sheets for this intermediate dispersion can be obtained from The Egyptian Coating Lacquer Manufacturing Company.

An alternative intermediate dispersion with a urethane binder 1504 is the waterborne HumiSeal® 2A64 urethane conformal coatings available from HumiSeal Corporation. This intermediate dispersion has a water base liquid 1506 and a urethane binder 1504. The HumiSeal® 2A64 has a dielectric constant of 3.5 and surface resistivity of $250 \times 10^{12}$ ohms when measured in accordance with ASTM D257. The Technical Data Sheet for this intermediate dispersion can also be obtained from HumiSeal Corporation.

The thermal loading material can be any non-electrically conductive, highly thermally conductive material having a thermal conductivity of greater than 20 W/mK. Preferably, the thermal conductivity of the thermal loading material is greater than 30 W/mK. In still other preferred embodiments, the thermal conductivity of the thermal loading material is greater than 100 W/mK. Examples of thermal loading material 1400 were provided above with reference to FIG. 14, namely, boron nitride (BN) 1406, aluminum oxide ($AlO_3$) 1408 and magnesium oxide (MgO) 1410. It should be apparent to those of ordinary skill in the art that other thermal loading materials 1400 now or later developed can be utilized.

In one particular embodiment, thermal loading material 1400 is boron nitride. In some embodiments such as those in which boron nitride is added to an intermediate dispersion, the boron nitride is provided in powder form. Boron nitride is a man-made ceramic having highly refractory qualities with physical and chemical properties similar to carbon. In one embodiment, thermal loading material 1400 is a graphite-like boron nitride (g-BN), more commonly referred to as hexagonal boron nitride (h-BN). In another embodiment, thermal loading material 1400 is a cubic boron nitride (c-BN), more commonly referred to as diamond Boron Nitride. H-BN has soft, lubricious qualities while c-BN is hard and abrasive. Specific examples of boron nitride include the many of the coarse and file mesh, high and low density CarboTherm™ BN powders available from Carbonundum Corporation, Amherst, N.Y. (CarboTherm is a trademark of Carbonundum Corporation). In other embodiments, one or more of the many grades of Boron Nitride available from Advanced Ceramics Corporation, Cleveland, Ohio can be used.

As noted, thermal loading material 1400 can also be aluminum oxide ($Al_2O_3$). In one embodiment, the aluminum oxide thermal loading material 1400 is the Aldrich product 23,474-5 aluminum oxide powder available from the Sigma-Aldrich Company, Milwaukee, Wis. Other aluminum oxide powders could also be used depending on the desired characteristics of the thermally conductive dielectric coating 1502. In one embodiment, the grade of aluminum oxide powder is between 10–5000 mesh. The Technical Data Sheets for these and other aluminum oxide powders are available from Sigma-Aldrich.

The other noted thermal loading material 1400 was magnesium oxide (MgO). In one embodiment, the magnesium oxide thermal loading material 1400 is the Aldrich product 342815 fused magnesium oxide having a 150–325 mesh and an assay of 95%. In another embodiment, the magnesium oxide thermal loading material 1400 is the Aldrich product 342823 fused magnesium oxide having a 40 mesh and an assay of 90%. In further embodiment, the magnesium oxide thermal loading material 1400 is the Aldrich product 342777 fused magnesium oxide chips having a –4 mesh and an assay of 99.9%. In a still further embodiment, the magnesium oxide thermal loading material 1400 is the Aldrich product 342785 fused magnesium oxide pieces having a 3–12 mm size and an assay of 99.95%. Other magnesium oxide powders could also be used depending on the desired characteristics of the thermally conductive dielectric coating 1502. The Technical Data Sheets for these and other magnesium oxide powders are available from Sigma-Aldrich.

Following are six categories of exemplary formulations for thermally conductive dielectric dispersion 1500. Each example formulation provides a range of percentages (by weight) for each component.

| Example 1: Boron Nitride & Acrylic Dispersion 1500 | |
|---|---|
| Thermal loading material 1400: | 10%–80% BN, 0.1–10 micron powder |
| Binder 1504: | 90%–20% Acrylic |
| Base Liquid 1506: | water or organic solvent |
| Curing: | UV or thermally cured |

The binder 1504 and base liquid 1506 can be provided in the above-noted acrylic intermediate dispersions. In accordance with the present invention, such intermediate dispersions are doped with the specified thermal loading material 1400 to form one embodiment of thermally conductive dielectric dispersion 1500.

| Example 2: Boron Nitride & Urethane Dispersion 1500 | |
|---|---|
| Thermal loading material 1400: | 10%–80% BN, 0.1–10 micron powder |
| Binder 1504: | 90%–20% Urethane |
| Base Liquid 1506: | water or organic solvent |
| Curing: | UV and/or thermally cured |

The binder 1504 and base liquid 1506 can be provided in the above-noted urethane intermediate dispersions. In accordance with the present invention, such intermediate dispersions are doped with the specified thermal loading material 1400 to form one embodiment of thermally conductive dielectric dispersion 1500.

| Example 3: Aluminum Oxide & Acrylic Dispersion 1500 | |
|---|---|
| Thermal loading material 1400: | 10%–80% $Al_2O_3$, 100 mesh, 99% corundum, alpha-phase |
| Binder 1504: | 90%–20% Acrylic |
| Base Liquid 1506: | water or organic solvent |
| Curing: | UV or thermally cured |

The binder 1504 and base liquid 1506 can be provided in the above-noted acrylic intermediate dispersions. In accordance with the present invention, such intermediate dispersions are doped with the specified thermal loading material 1400 to form one embodiment of thermally conductive dielectric dispersion 1500.

| Example 4: Aluminum Oxide & Urethane Dispersion 1500 | |
|---|---|
| Thermal loading material 1400: | 10%–80% $Al_2O_3$, 100 mesh, 99% corundum, alpha-phase |
| Binder 1504: | 90%–20% Urethane |
| Base Liquid 1506: | water or organic solvent |
| Curing: | UV and/or thermally cured |

The binder 1504 and base liquid 1506 can be provided in the above-noted urethane intermediate dispersions. In accordance with the present invention, such intermediate dispersions are doped with the specified thermal loading material 1400 to form one embodiment of thermally conductive dielectric dispersion 1500.

| Example 5: Magnesium Oxide & Acrylic Dispersion 1500 | |
|---|---|
| Thermal loading material 1400: | 10%–80% MgO, 150 mesh |
| Binder 1504: | 90%–20% Acrylic |
| Base Liquid 1506: | water or organic solvent |
| Curing: | UV or thermally cured |

The binder 1504 and base liquid 1506 can be provided in the above-noted acrylic intermediate dispersions. In accordance with the present invention, such intermediate dispersions are doped with the specified thermal loading material 1400 to form one embodiment of thermally conductive dielectric dispersion 1500.

| Example 6: Magnesium Oxide & Urethane Dispersion 1500 | |
|---|---|
| Thermal loading material 1400: | 10%–80% MgO, 150 mesh |
| Binder 1504: | 90%–20% Urethane |
| Base Liquid 1506: | water or organic solvent |
| Curing: | UV and/or thermally cured |

The binder 1504 and base liquid 1506 can be provided in the above-noted urethane intermediate dispersions. In accordance with the present invention, such intermediate dispersions are doped with the specified thermal loading material 1400 to form one embodiment of thermally conductive dielectric dispersion 1500.

It should be appreciated that the above formulations are exemplary only. For example, as noted above, that there are many variations in the characteristics of binder 1504 and the intermediate dispersion in which it is suspended, as well as the thermal loading material 1400. The characteristics of the resulting thermally conductive dielectric coating 1502 will vary according to the selected combination of properties. In addition, thermally conductive dielectric dispersion 1500 can include other components. Such other components can include materials to facilitate a particular process or to alter a particular characteristic.

The utilization of a thermal loading material increases the thermal transfer ability of dielectric coating 102 to the point where overheating of the underlying printed circuit board components is eliminated. Thus, it should be appreciated that thermally conductive conformal dielectric coating 1502 can have applications beyond conformal EMI shield 100. For example, dielectric coating 102 can be applied alone to a printed circuit board. In such an application dielectric coating 1502 can provide protection against adverse environmental effects such as humidity, salt air and the like while not causing a significant rise in the temperature of the components on the printed circuit board. As noted, thermally conductive dielectric coating 1502 is one preferred embodiment of dielectric coating 102. As such, dielectric coating 102 is generally referenced below.

Referring now to FIG. 15B, the state of thermally conductive dielectric dispersion 1500 after curing is a contiguous solid adhered to the surface of printed wiring board or component 106, referred to as a thermally conductive dielectric coating. As shown in FIG. 15B, the base liquid 1506 in which the solids were borne is removed during curing. When cured, binder 1504 binds together to form a contiguous, rigid surface in which thermal loading material 1400 is suspended, forming a thermally conductive dielectric coating 1502 secured to wiring board or component surface 106.

As is well-known in the art, thermally conductive dielectric dispersion 1500 can include components that facilitate a desired curing process. For example, in one embodiment, thermally conductive dielectric dispersion 1500 can be UV cured. In such an embodiment, photosensitizing agents such as a UV-curable acrylic can in included in thermally conductive dielectric dispersion 1500. Alternatively, certain embodiments of the thermally conductive dielectric dispersion 1500 can be heat cured. In such embodiments, thermally conductive dielectric dispersion 1500 includes a heat curing agent such as an anhydride. In one embodiment, additional materials are added to thermally conductive dielectric dispersion 1500 to facilitate both temperature and UV curing. For example, in one embodiment, thermally conductive dielectric dispersion 1500 includes the Shadowcure® material available from the Loctite Corporation, Rocky Hill, Conn.

Shadowcure includes both photosensitizing and heat curing agents. Shadowcure enables® to cure in response to both exposure to UV light and temperature. This embodiment is desirable in those applications in which the printed circuit board configuration is such that there are small gaps or spaces between component leads, neighboring components and between components and the surface of the printed wiring board. These various spaces are referred to herein generally and collectively as "cavities." In such applications, UV light may not be able to impinge upon the dielectric coating 102 located in such cavities. As a result, a UV curing process may only result in the curing of that portion of the dispersion applied to openly exposed surfaces. However, the printed circuit board can then be heat treated to cure the remaining portions of dielectric coating 102.

In certain applications there may be surfaces on printed circuit board 304 that are more difficult to adhere to despite dielectric coating 102 having a combination of properties noted above. In particular, cavities and very sharp or pointed surfaces provide less opportunity for a material to adhere to the defining surfaces. In such applications, it is preferred that a conservative approach is taken with regard to coverage since incomplete coverage of the printed circuit board can lead to an electrical short circuit when conductive coating 104 is applied. Accordingly, in such applications, dielectric coating 102 can be applied in multiple applications, each resulting in a layer of dielectric material coating the covered region of the printed circuit board. For example, when implementing any of the above embodiments of dielectric coating 102, it is preferred that dielectric coating 102 is applied in two applications of approximately 1 mil each, for a total thickness of approximately 2 mils. Alternative embodiments have a dielectric coating thickness 1.5–2.5 mils; and 2–4 mils. Each layer is preferably applied with 4 or 5 cross-coats, with a delay or pause between the first and second applications of approximately 1 to 2 minutes to allow the first layer to set up before the second layer is applied.

In such embodiments, the initial layer may have a void located at the apex of a sharp edge or within a cavity. Each subsequent cross-coat of dielectric coating 102 adheres to the prior layer as well as the underlying printed circuit board surface, reducing the size of the void. Ultimately, the void is filled or eliminated with a subsequent cross-coat or layer of dielectric material. As is well-known in the relevant arts, cross-coats are implemented to insure uniform application of dielectric coating 102 when each layer of dielectric coating 102 is applied manually. However, such cross-coats are not necessary when dielectric coating 102 is applied with robotic or other automated equipment. The temperature at which dielectric coating 102 is applied can vary depending on the selected embodiment. For example, certain embodiments of dielectric coating 102 is applied at room temperature, between 60–100 degrees Fahrenheit, although other application temperatures may be specified by the manufacturer of the thermally conductive dielectric coating components. Accordingly, it should be apparent to those of ordinary skill in the art that the application temperature as well as other aspects of the manufacturing process will vary with the composition of dielectric coating 102 and, in general, the application.

Although dielectric coating 102 can be cured at room temperature, to expedite manufacturing processes and to remove any water-based components from dielectric coating 102, dielectric coating 102 is preferably thermally cured at an elevated temperature below that which the underlying printed circuit board can withstand. It should be apparent to those of ordinary skill in the art that dielectric coating 102 need only be cured to the extent necessary to apply conductive coating 104. As will be described below, both dielectric coating 102 and conductive coating 104 are thermally cured after conductive coating 104 is applied.

It should be understood that the thickness of dielectric coating 102 can differ from that noted, depending on the application. For example, in an alternative embodiment, dielectric coating 102 is formed with 2 to 4 cross-coats for each of 4 layers of dielectric material, resulting in a thickness of approximately 6 to 10 mils. Thus, dielectric coating 102 has a combination of adhesion and viscosity that enables it to form a uniform, contiguous surface over the coated surfaces with no voids formed therein.

An example of dielectric coating 102 applied to the integrated circuit shown in FIG. 2A is illustrated in FIG. 2B. As shown therein, dielectric coating 102 adheres to the entire exposed surface of integrated circuit leads 208, including those lead surfaces that are adjacent to and facing the side surface of integrated circuit 204. In addition, dielectric coating 102 coats the side surfaces of integrated circuit body 204 that are accessible only through gaps between neighboring leads 208. Note that the thickness of dielectric coating 102 may vary slightly, being greater where access is more direct. Nevertheless, dielectric coating 102 completely coats the entire exposed surface of integrated circuit 204; that is, there are no voids, gaps, breaks or spaces in dielectric coating 102.

C. Conductive Coating

As noted, conductive coating 104 is the outer coating of conformal EMI shield 100, providing the requisite EMI shielding for the coated regions of the printed circuit board. As such, conductive coating 104 is applied to the surface of dielectric coating 102 which has been applied previously to selected regions of the printed circuit board. Due to the complete coverage provided by dielectric coating 102, conductive coating 104 does not contact any portion of the printed circuit board region that has been coated previously by dielectric coating 102.

Generally, conductive coating 104 has the capability to adhere to the surface of dielectric coating 102 so as to conformally coat and adhere to the underlying region of the printed circuit board. In certain embodiments, conductive coating 104 will also likely conformally coat and adhere to predetermined components of the printed circuit board itself, particularly ground pads, strips and moats (collectively, ground lands) in the printed wiring board 202. Conductive coating 104 may also be required to adhere to other predetermined elements on the printed circuit board in some applications. For example, in hybrid shielding arrangements in which conformal EMI shield 100 is used in conjunction with a conventional metallic box, conformal EMI shield 100 preferably adheres to a surface of such a metallic box.

As with dielectric coating 102, the relevant material properties of conductive coating 104 include primarily viscosity and adhesion. The combination of these properties should be sufficient to enable conductive coating 104 to be applied via atomization spray techniques and, once applied, to adhere to the surfaces in the immediate vicinity of where it was applied. Specifically and in one embodiment, the viscosity of conductive coating 104 can range from 10–40" Zahn cup #3 (full body). In another embodiment, conductive coating 104 has a viscosity of 15–30" Zahn cup #3 (full body).

Conductive coating 104 has an adhesion suitable to enable it to adhere to the noted materials, in particular, dielectric coating 102. As the viscosity of conductive coating 104 decreases, the adhesiveness may need to increase to ensure conductive coating 104 adheres to the surface to which it is applied in the immediate vicinity in which it is applied. In general, conductive coating 104 preferably has an adhesion that satisfies the ASTM 5B rating.

To supplement the adhesion of conductive coating 104 to dielectric coating 102, in one embodiment dielectric coating 102 and conductive coating 104 have the same or similar composite resin structures that facilitate bonding between the two coatings. Such a bonding will be maintained over significant periods of time, preferably inclusive of the life of the printed circuit board, due to the two coatings having similar coefficients of thermal expansion. This reduces the shearing stresses between the two coatings as the printed circuit board and, hence, conformal EMI shield 100, heat and cool during the operational life of the printed circuit board. For this reason, when dielectric coating 102 includes the noted CQW-L200DF dielectric coating, it is preferred that conductive coating 104 is the MQW-L85 conductive coating noted below due to the similarity of the composite resin structures.

In one embodiment, conductive coating 104 is an aqueous coating composition with particles of conductive metal suspended therein. Such conductive metals can be, for example, copper, silver, nickel, gold or any combination thereof. The ohmic resistance of conductive coating 104 is between 0.05 and 0.2 ohms per square at a film thickness of approximately 1.0 mil. In one embodiment of conformal EMI shield 100, conductive coating 104 is TARA EMI-RFI shielding, Formula MQW-L85 manufactured by The Egyptian Lacquer Manufacturing Company, Franklin, Tenn., USA. MQW-L85 is described in U.S. Pat. Nos. 5,696,196 and 5,968,600 both of which are hereby incorporated by reference herein in their entirety. MQW-L85 is designed for coating product enclosures or housings such as those used in cellular phones. MQW-L85 has a viscosity in the range of approximately 15–20" Zahn cup #3(full body).

The thickness of conductive coating 104 should be sufficient to prevent the passage of the electromagnetic radiation generated by the coated printed circuit board 304. It should be apparent that the thickness of conductive coating 104 is a function of the type and characteristics of the materials used to form conductive coating 104. In one embodiment, conductive coating 104 is approximately 1.1±0.2 mils; that is, a thickness in the range of 0.9 to 1.3 mils provides significant shielding effectiveness. However, it should be understood that in alternative embodiments, conductive coating 104 has a thickness that depends on its ohmic resistance and desired shielding effectiveness at the anticipated electromagnetic frequencies to be shielded.

As with dielectric coating 102, MQW-L85 is preferably applied at room temperature, between 70–80 degrees Fahrenheit, although an application environment of 60–100 degrees Fahrenheit is suitable. Preferably, multiple cross-coats are applied for one or more layers of conductive coating 104. After application, the MQW-L85 conductive coating 104 is cured at approximately 140–160 degrees Fahrenheit for approximately 30 minutes. It should be understood that lower temperatures can be used, depending on the temperature tolerance of the printed circuit board. The curing time may need to be accordingly altered. However, it is preferred that this embodiment of conductive coating 104 is cured at the noted temperatures because the elevated temperature facilitate the alignment of the metallic flakes. When the metallic flakes orient themselves in this way, the conductivity of the conductive coating 104 is maximized.

A secondary effect of conductive coating 104 is that it is thermally conductive. The heat generated by coated printed circuit board regions are transferred through dielectric coating 102 to conductive coating 104 which conducts through the surface of the board. The heat can then travel off the printed circuit board, primarily by dissipating through convection or through conduction to a heat sink.

As with dielectric coating 102, conductive coating 104 can be applied to the sharp edges and cavities of printed circuit board 304. This is illustrated in FIG. 2C in which conductive coating 104 covers dielectric coating 102 on integrated circuit 204. Conductive coating 104 coats the side of integrated circuit body 206 behind leads 208, as well as substantially all of the surface of leads 208 themselves. In those circumstances in which the gap between neighboring leads 208 is reduced due to the presence of dielectric coating 102, conductive coating 104 may bridge the gap as shown in FIG. 2C.

Although suitable for many applications of the present invention, there are well-known environmental concerns associated with the use of metallized coatings that restrict and increase the cost of disposal, reuse, etc. Also, to avoid oxidation, an additional protective layer may be applied to those portions of the printed circuit board that are not coated with dielectric coating 102, namely, ground lands. Such a well-known protective layer prevents oxidation of the ground lands due to oxidation.

To overcome these particular limitations of metallized coatings and broaden the possible applications of conformal EMI shield 100, in one aspect of the present invention, conductive coating 104 comprises an intrinsically conducting polymer (ICP). As the name implies, intrinsically conducting polymers are electrically conductive polymer materials. Importantly, intrinsically conducting polymers are polymer materials that have a significant conductivity without the addition, or doping, of some other material such as a noble metal.

Figure 12:
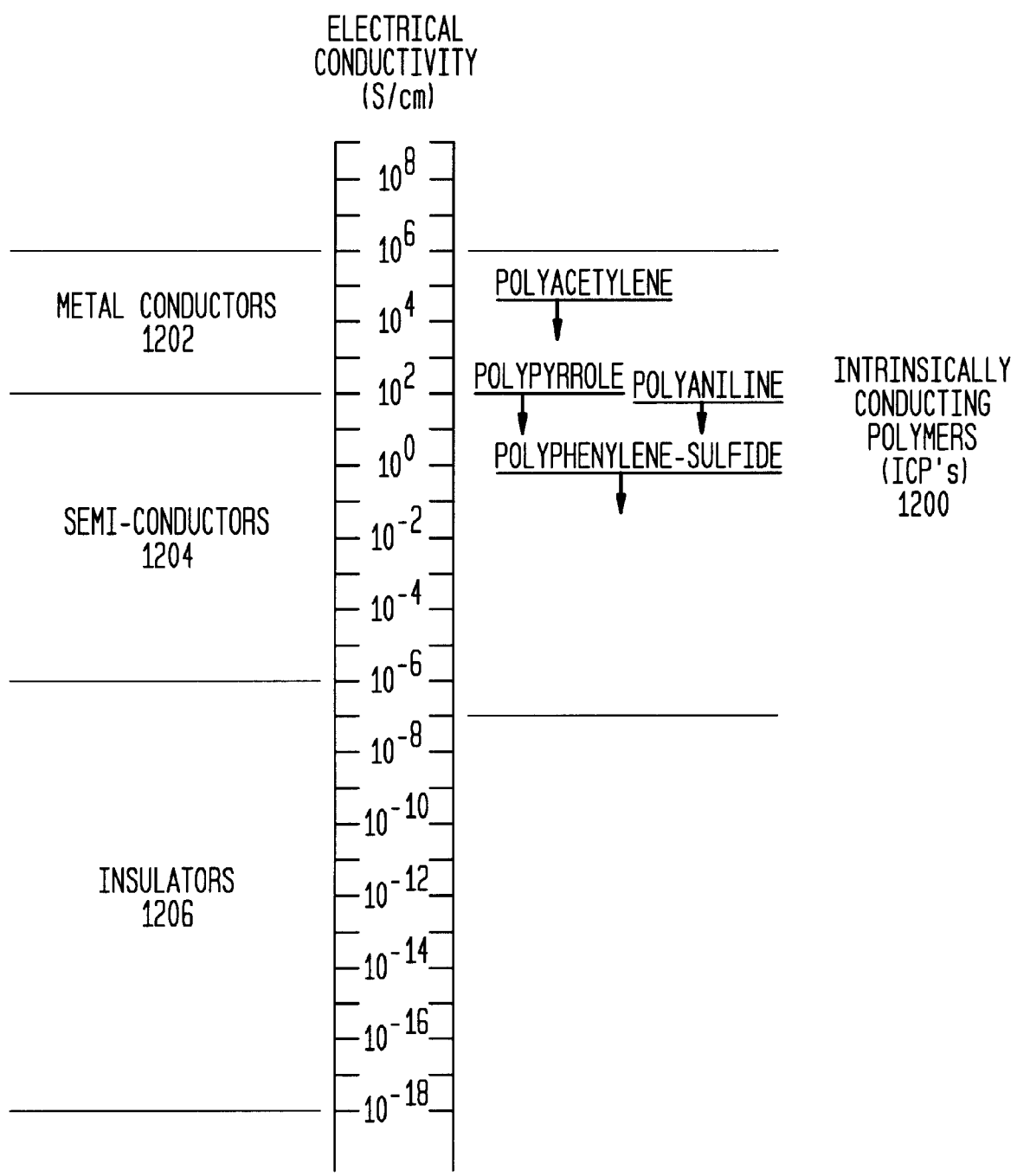
FIG. 12 is a scale illustrating the relative electrical conductivity of intrinsically conductive polymers (ICPs), metal conductors, semi-conductors and insulators.

FIG. 12 is a scale illustrating the relative conductivity of intrinsically conductive polymers, metal conductors, semiconductors and insulators. In this illustrative scale, conductivity is presented in units of Siemens per centimeter (S/cm). The vertical scale in the middle of the figure sets forth the conductivity in increments of 100 S/cm, from $10^{-18}$ S/cm to $10^8$ S/cm. On the left-hand side of the scale are three categories of well-known materials showing the range of conductivity provided by each category of material. For example, insulators 1206 have a conductivity of approximately $10^{-8}$ to $10^{-18}$ S/cm. As evidenced by these values, insulators effectively inhibit electrical conduction. Examples of insulators include, for example, general-purpose thermoplastics, polyethylene, polypropylene, PVC, polystyrene and PTFE. Semi-conductors 1204 have a conductivity of approximately $10^{-6}$ to $10^0$ S/cm. Two well know semiconductor materials are germanium and silicon. As shown in FIG. 12, the conductivity of metal conductors 1202 is approximately $10^2$ to $10^6$ S/cm. Examples of metals that serve well as conductors include, for example, copper, silver and gold. Thus, metal conductors have the greatest conductivity, semiconductors generally have a lower conductivity and insulators allow for minimal or no conduction.

For ease of comparison, intrinsically conductive polymers are positioned on the right side of the scale. As shown, the conductivity of intrinsically conductive polymers ranges from slightly greater than $10^{-8}$ S/cm to slightly less than $10^6$ S/cm, making them analogous to the conductive metals. Such conductivity levels make intrinsically conductive polymers suitable for use in conductive coating 104. Some examples of intrinsically conductive polymers that can be used in accordance with the teachings of the present invention include but are not limited to polypyrrole, polyanaline, polyacetylene, polyththiophenes, poly(p-phenylele vinlene)s, poly-thylenedioxythiophene and polyphenylenesulfide.

Once applied and cured, conductive coating 104 is a substantially dry, solid coating. However, the state of conductive coating 104 when prior to application can vary. Preferably, the conducting polymer is suspended in a dispersion to facilitate the preferred application method of conventional spray atomization techniques. Such a dispersion is referred to herein as a conductive polymeric dispersion. FIG. 13 is a series of images illustrating the state of one preferred embodiment of a conductive polymeric dispersion 1300 when applied (FIG. 13A), cured (FIG. 13B) and used (FIG. 13C) in accordance with the teachings of the present invention.

In FIG. 13A, conductive polymeric dispersion 1300 is shown after it has been applied to dielectric coating 102 but before it is cured. In one embodiment, conductive polymeric dispersion 1300 is a single component polymeric dispersion. Examples of such an embodiment include a dispersion formed by suspending intrinsically conductive polymer particles in water or an organic solvent. It is anticipated that in certain applications, such a dispersion may not cure to form a conductive coating 104 that uniformly covers and adheres well to dielectric coating 102.

In contrast, the illustrative embodiment of conductive polymeric dispersion 1300 illustrated in FIG. 13A is formed by suspending a substrate resin particles 1302 in a base liquid 1304. As shown in FIG. 13, substrate 1302 includes larger components, commonly referred to as beads. Substrate 1302 is a material such as acrylic or polyurethane to which intrinsically conductive polymer 1200 adheres. Thus, when combined with intrinsically conductive polymer 1200 in base liquid 1304, intrinsically conductive polymer 1200 coats the exterior surfaces of substrate beads 1302 to form what is commonly referred to as a core-shell dispersion. Thus, the illustrative conductive polymeric dispersion 1300 is referred to herein as a core-shell dispersion.

As one of ordinary skill in the art would find apparent, conductive polymeric dispersion 1300 is a heterogeneous solution in which the intrinsically conductive polymer 1200 is dispersed in a base liquid 1304 such as water or organic solvent. As the contiguity of the intrinsically conductive polymer component in the cured conductive coating 104 increases, so too does the ability of conductive coating 104 to conduct electricity. Accordingly, it is preferable that the suspension is substantially uniform to insure the contiguity of the cured intrinsically conductive polymer in the resulting conductive coating 104.

With regard to base liquid 1304, waterborne dispersions are preferred because they are substantially easier to process that dispersions using organic solvents. In addition, the use of water eliminates the environmental and processing drawbacks associated with the use of organic solvent emissions. However, organic solvents including, for example, N-Methyl-Pyrolidinone (NMP), various alcohols, acetone, Methyl-Ethyl-Ketone (MEK), and others, may be suitable in certain applications.

The state of conductive polymeric dispersion 1300 after curing is shown in FIG. 13B. In this aspect of the invention, conductive coating 104 is referred to as a conductive polymeric coating. When cured, substrate beads 1302 bind together to form a contiguous, rigid surface to which intrinsically conductive polymer 1200 adheres, forming conductive coating 104. In addition, conductive polymeric dispersion 1300 includes other components 1306. Such other components can include materials to facilitate a particular process or to alter a particular characteristic. To insure substrate beads 1302 adhere well to the printed circuit board surface, dispersion 1300 includes binder 1302. When cured, binder resin particles 1308 bind to each other and solidify to form a relatively thin adhering layer over substrate beads 1302.

As shown in FIG. 13B, the liquid base 1304 in which the solids were borne is removed during curing. Once removed, conductive coating 104 includes substrate beads 1302 with their coating of conductive polymer 1200 secured to dielectric coating 102 by a binder 1306. Binder 1306 is an acrylic or urethane that is suspended in dispersion 1300 (FIG. 13A) which becomes a solid when cured (FIG. 13B). Thus, when cured, substrate beads 1302 come together and contact each and are adhered to dielectric coating 102 by binder 1306.

FIG. 13C illustrates the operation of conductive polymeric coating 104. When an electric charge 1310 is applied to conductive polymeric coating 104, it travels across intrinsically conductive polymer 1200 coating the side of substrate beads 1302 opposite the side of substrate beads 1302 in contact with dielectric coating 102.

As is well known in the art, conductive polymeric dispersion 1300 can include components that facilitate a desired curing process. For example, in one embodiment, conductive polymeric dispersion 1300 can be UV cured. In such an embodiment, other components 1306 includes any of the well-known photosensitizing agents such as a UV-curable acrylic. Alternatively, certain embodiments of the conductive polymeric dispersion can be heat cured. In such embodiments, conductive polymeric dispersion 1300 includes a heat curing agent such as an anhydride. In one preferred embodiment, additional materials are added to conductive polymeric dispersion 1300 to facilitate a both temperature and UV curing. For example, in one embodiment, dispersion 1300 includes the Shadowcure® material available from the Loctite Corporation, Rocky Hill, Conn.

Shadowcure includes both photosensitizing and heat curing agents. Shadowcure enables dispersion 1300 to cure in response to both exposure to UV light and temperature. For similar reasons noted above, this embodiment is desirable in those applications in which the printed circuit board configuration is such that there are cavities between component leads, neighboring components and between components and the surface of the printed wiring board. It should be understood by those of ordinary skill in the art that other additives can be included in the conductive polymeric dispersion to achieve a desired property or behavior. For example, N-Methyl-Pyrolidinone (NMP) can be added to the dispersion to reduce the minimum film forming temperature.

The following properties of intrinsically conductive polymers that impart substantial benefits to conductive coating 104 include conductivity, transparency and redox potential. With regard to conductivity, it was noted that intrinsically conductive polymers are highly conductive, akin to noble metals. Conductivity increases as the applied thickness of the conductive polymeric coating increases. Conductivity can also be modified by adjusting the concentration of intrinsically conducting polymer 1200 in dispersion 1300. In one embodiment, the conductivity of conductive coating 104 is between approximately $10^{-8}$ to $10^6$ S/cm. In another embodiment, the conductivity is approximately between $10^{-2}$ to $10^6$ S/cm. In a further embodiment, the conductivity is approximately between $10^{-1}$ to $10^6$ S/cm. In a further embodiment, the conductivity is approximately between $10^{-1}$ to $10^2$ S/cm. It should be understood that the conductivity can be any of the conductivity values associated with each of the exemplary intrinsic conductive polymers illustrated in FIG. 12.

Another property of intrinsically conductive polymers is transparency. In certain circumstances, it may be desirable to be able to view the underlying printed circuit board after it is coated with conformal EMI shield 100. This is more difficult with metallized coatings due to their opaque. In contrast, polymeric conductive coating of this aspect of the invention can be transparent. Intrinsically conductive polymers are relatively transparent materials. Depending on the applied thickness of conductive coating 104, the underlying components may be observable.

This transparency of conductive coating 104 can be modified by adjusting the thickness of conductive coating 104. The thinner the layer of conductive coating 104, the higher the transparency. Since this relationship is inverse to that of conductivity, a tradeoff between the two properties is to be selected to achieve a desired combination of material properties. The transparency of conductive coating 104 provides the advantage of allowing for the viewing of the dielectric coating 102 and printed circuit board components that are covered by conductive coating 104.

Another property of intrinsically conductive polymers is that the are extremely corrosion resistant. This reduction in corrosion, or oxidation, is commonly referred to as redox potential. The redox potential of aluminum and iron, which are commonly found in conventional metallized coatings, is approximately −1.6 volts and −0.4 volts, respectively. This causes conventional metallized coatings to oxidize the metallic surfaces to which they are applied. The uncontrolled mixture of iron oxides and —hydroxides corrodes the metal surfaces. To prevent such an occurrence, a protective layer is often applied prior to the metallized coating.

In contrast, the redox potential of conducting polymers is greater than zero and, preferably, between 0 and 1 volt. In one embodiment, the redox potential is approximately +0.8 volts, about the same as the redox potential of noble metals such as silver. This causes the intrinsically conductive polymer to passivate the metallic surfaces to which they are applied. That is, the redox potential of conducting polymers reduces the electrochemical potential of the metal, causing the formation of a solid and strong protective iron oxide layer, for example, $Fe_3O_4$ or $FeO(OH)$. This hard oxide layer protects the rest of the material against corrosive attack. Thus, a further advantage that makes this aspect of the present invention preferable is that corrosion on the metal parts of the printed circuit board is minimized or eliminated.

In one particular embodiment, the conductive polymeric dispersion is the ConQuest® conductive dispersion available from DSM Research, The Netherlands. (ConQuest® is a registered trademark of DSM N.V. Company Netherlands.) For example, in one particular application, the ConQuest XP 1000 family of waterborne dispersions is preferred. ConQuest XP 1000 is a water-borne, electrically conductive dispersion that derives its electrical conductivity from the electrically conductive polymer polypyrrole. This product family as approximately a 20% solids content, and can be further diluted with the addition of water or with isopropal alcohol or another waterborne dispersion. Other properties include a pH of 2–4 and a coating conductivity of >0.2 S/cm.

ConQuest XP 1000 can be applied to various substrates found in printed circuit boards. Improved adhesion can be obtained by adding other strongly adhesive, waterborne dispersions. Addition levels up to 30% (based on solids) of non-conductive compatible dispersions will not affect the conductivity to a great extent. Examples of compatible dispersions include Uradil AZ554 Z-50, VV 240 SC 341 and SC 162 DSM Resins, all of which are available from DSM Research.

ConQuest XP 1000 has a Minimum Film Forming Temperature (MFT) of 50° C. Regular drying temperatures are between 60° C. and 120° C. This temperature can be reduced by adding NMP (N-Methyl-Pyrrolidinone) or DPNB (Di-PropyleneglycolN-Buthylether). Room temperature film forming properties are achieved at a 10% (DPNB) or 25% (NMP) addition level, based on the amount of solids in the formulation.

To achieve a desired conductivity, the ConQuest XP 1000 conductive polymeric dispersion is applied in one or more applications to a dry layer thickness of approximately 3 microns depending on the concentration of the conducting polymer in the conductive polymeric dispersion. In an alternative embodiment, the applied thickness is approximately 3–5 microns.

It should be appreciated that there are numerous variations of the above embodiments that can be altered while remaining within the scope of the present invention. For example, in certain embodiments, a novalac-type process is used.

One advantage of this latter embodiment of conductive coating 104 over conventional techniques is that the ICPs in the conductive coating do not suffer from the well known environmental concerns associated with metals. In particular, the ICPs in conductive coating 104 can be easily and cost effectively disposed. In addition, the material can be recycled easily, increasing manufacturing yield. This advantage becomes even more significant when the conductive polymeric dispersion utilizes a base liquid of water. Such waterborne dispersions eliminate the environmental problems associated with organic solvents.

Another advantage of the present invention is that the ICPs are transparent. Depending on the applied thickness, the underlying components can be observed. This is in contrast to current metal coating which are opaque. A further advantage of the invention is that ICPs are resistant to corrosion. Unlike metallized coatings, there is no need to apply an additional protective layer to prevent oxidation.

3. A Printed Circuit Board with a Conformal EMI Shield

A. General

Figure 3:
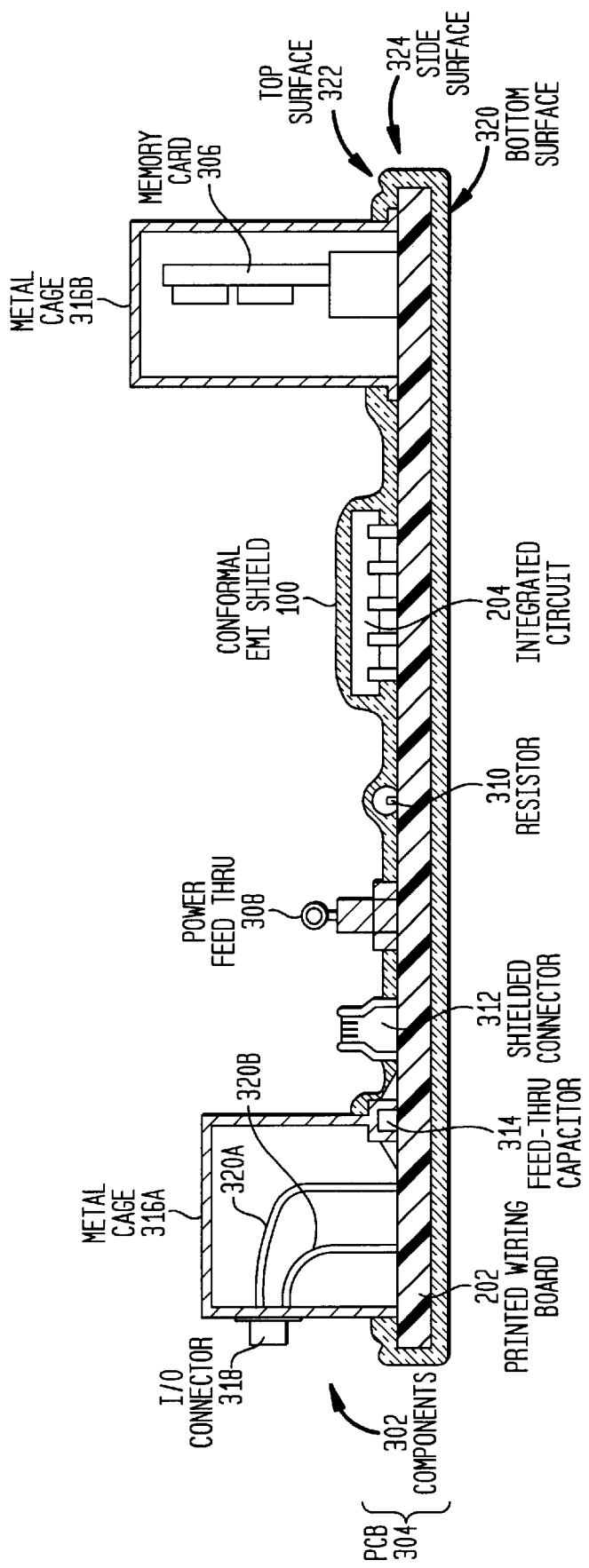
FIG. 3 is a side cross-sectional view of a printed wiring board with various components mounted thereon with one embodiment of the conformal EMI shield illustrated in FIG. 1 applied thereto.

FIG. 3 is a cross-sectional view of a portion of a printed circuit board 304 with conformal EMI shield 100 of the present invention applied thereto to cover the exposed surfaces of selected portions of printed circuit board 304. Printed circuit board 304 of the present invention comprises, generally, printed wiring board 202 with components 302 mounted thereon, with both shielded at least in part, and preferably completely, with conformal EMI shield 100 of the present invention. In the embodiment illustrated in FIG. 3, conventional metal cages 316A and 316B are utilized to shield connector wires 320A and 320B of I/O connector 318. Conformal EMI shield 100 is applied to desired regions or portions of printed circuit board 304. Such regions or portions include regions of printed wiring board 202 as well as all or part of certain components 302.

Printed circuit board 304 includes a memory card 306 mounted on printed wiring board 202. Memory card 306 is shielded by a conventional metal cage 316B. Printed circuit board 304 also includes integrated circuit 204 introduced above with reference to FIGS. 2A–2C, a resistor 310 and a power feed-through connector 308. Power feed-through connector 310 carries low frequency signals and, therefore, does not need to be shielded. In contrast, another type of connector mounted on printed wiring board 202 is shielded connector 312. Connector 312 receives, for example, high speed data signals. Shielded connector 312 has an EMI shield (described in detail below) whereas power feed-through connector 308 does not.

A metal cage 316A shields I/O cables or leads 320A and 320B of I/O connector 318. I/O connector 318 may be, for example, an RS232 connector, among others. Metal cage 316A includes a surface-mounted feed-through capacitor 314 for preventing signals from being conducted out of metal cage 316A on the low frequency signal traces to which it is connected. Capacitor 314 has a lead in the form of solder spots and is connected to a ground connection.

B. Printed Circuit Board Coverage

In accordance with one preferred embodiment, coated printed circuit board 304 is completely shielded with conformal EMI shield 100. That is, conformal EMI shield 100 is a continuous coating covering all surfaces of printed circuit board 304. However, conformal EMI shield 100 need not cover the entire printed circuit board 304. For example, in one embodiment, there may be regions of printed circuit board for which EMI protection is unnecessary. In other circumstances, such as that shown in FIG. 3, other shielding mechanisms can be implemented on printed circuit board 304 in combination with conformal EMI shield 100 to provide the requisite EMI shielding.

In FIG. 3 metal cages 316 are used to shield I/O connector 318 leads 320 and memory card 306. In addition, ancillary parts of a product which generate minimal or no electromagnetic radiation do not warrant protective measures to be employed to limit such emissions. Such devices include, for example, interconnecting cables, power supplies, disk drives, etc. These and other, similar devices do not need to be coated with the conformal EMI shield of the present invention. As a result, access to such components and subassemblies can be made simpler. Thus, a printed circuit board 304 of the present invention is one that is at least partially coated with one embodiment of conformal EMI shield 100. In FIG. 3, this conformal EMI shield 100 covers a portion of top surface 322 of printed circuit board 304 in which components 302 are mounted, as well as a bottom surface 326 of printed circuit board 304.

As one of ordinary skill in the art would find apparent, different techniques can be implemented to apply conformal EMI shield 100 to specific regions of printed circuit board 304. For example, in one embodiment, conformal EMI shield 100 is selectively applied to the desired portions of a printed wiring board or components mounted thereon using highly directional air spraying techniques. Alternatively, printed circuit board 304 is masked before application of the dielectric coating 102 to avoid application to those regions of printed circuit board 304 that are not to be shielded.

C. Grounding of Conformal EMI Shield

Figure 4:
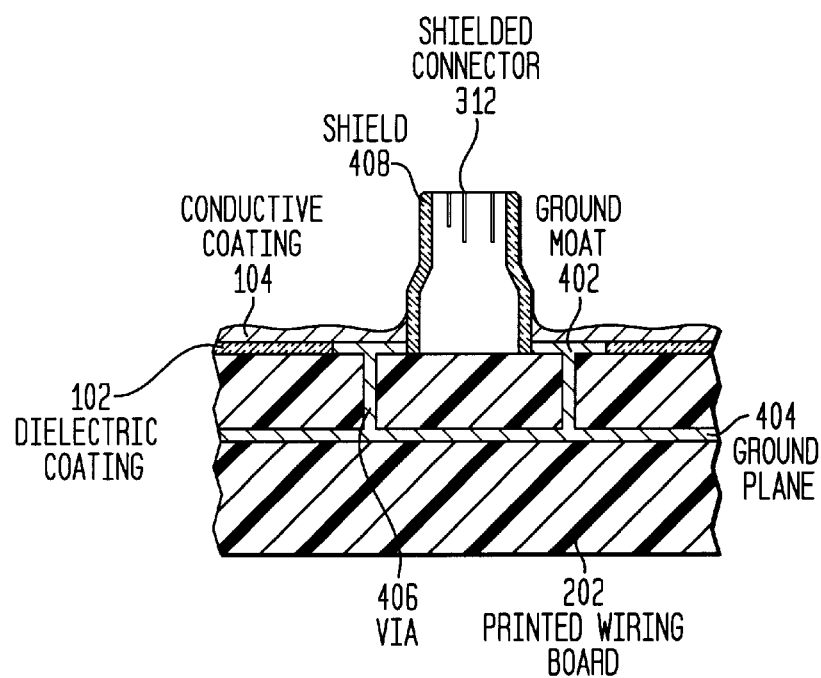
FIG. 4 is a cross-sectional view of a shielded connector such as that shown in FIG. 3 with a ground moat mounted on the printed wiring board that surrounds the connector and is covered by the conformal EMI shield of the present invention.
Figure 5:
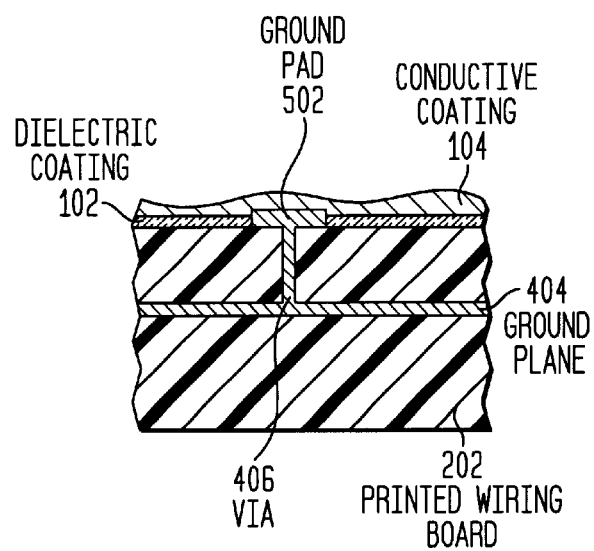
FIG. 5 is a cross-sectional view of a ground pad mounted on the printed wiring board and covered by the conformal EMI shield of the present invention.

Conductive coating 104 is preferably grounded at various locations on printed circuit board 304. In the following embodiments, conformal EMI shield 100 is connected electrically to a ground plane in printed wiring board 202. Two embodiments of making such a ground connection are illustrated in FIGS. 4 and 5. FIG. 4 is a cross-sectional view of a ground moat surrounding shielded connector 312 illustrated in FIG. 3. FIG. 5 is a cross-sectional view of a ground pad mounted on printed wiring board 202.

Referring now to FIG. 4, conformal EMI shield 100 is preferably grounded through a ground moat at locations where wires, leads, cables, etc., carrying high frequency signals are connected to printed wiring board 202. Conformal EMI shield 100 effectively provides a conductive loop around the signal wire connected to shielded connector 312. A current can be induced in that portion of conductive coating 104 surrounding shielded connector 312 due to the transmission of high frequency signals through the connector. To prevent such a current from traveling to other portions of printed circuit board 304 or to emanate off of the surface of conductive coating 104, ground moat 402 is provided in printed circuit board 304 surrounding signal connector 312. To insure complete shielding, ground moat 402 preferably surrounds completely shielded connector 312. One or more vias 406 connect ground moat 402 to ground plane 404. In the embodiment shown in FIG. 4, the vias 406 are blind vias since they do not pass through to the other side of printed wiring board 202. Preferably, there are a number of vias 406 distributed around ground moat 402 to reduce the distance of the conductive path to ground plane 404. Any signals generated in conductive coating 104 are immediately shunted to ground plane 404 through ground moat 402 and a via 406.

Note that dielectric coating 102 is applied to printed wiring board so as to not cover the surface of ground moat 402 and shielded connector 312. In one embodiment, this is achieved by masking ground moat 402 and shielded connector 312 prior to applying dielectric coating 102. Conductive coating 104 is applied so as to coat dielectric coating 102 as well as ground moat 402. This is achieved by removing the mask from ground moat 402 and masking shielded connector 312 prior to applying conductive coating 104. Importantly, either ground moat 402 and/or conductive coating 104 are electrically connected to shield 408 of shielded connector 312. Thus, any interference generated along the length of the signal lead, connector or conductive coating 104 is immediately shunted to ground. Thus, a ground moat 402 mounted on printed wiring board 202 completely around shielded connector 320 and connected electrically to a shield 408 of connector 312 and a ground plane 404 eliminates the EMI that can be transmitted by conductive coating 104 in the vicinity of shielded connector 312.

FIG. 5 is a cross-sectional view of a ground pad 502 mounted on printed wiring board 202. In one embodiment, conformal EMI shield 100 is grounded periodically through such ground pads 502 across all regions of conformal EMI shield 100. In certain applications, the performance of conformal EMI shield 100 is improved when it is grounded periodically. In one embodiment, this is achieved by providing one or more ground pads 502 across the shielded regions of printed circuit board 304. One such ground pad 502 is illustrated in FIG. 5, although there are many other embodiments which can be implemented.

Ground pad 502 is a surface mounted conductive pad connected to ground plane 404 through blind via 406. As with the embodiment illustrated in FIG. 4, dielectric coating 102 is applied to printed wiring board 202 so as to coat the surface of printed wiring board 202 and not ground pad 502. Conductive coating 104 is applied so as to is coat dielectric coating 102 and ground pad 502. This connects electrically conductive coating 104 to ground plane 404.

In an alternative embodiment, vias 406 transect the entire printed wiring board 202; that is, they extend from ground plane 404 to both surfaces of printed wiring board 202. Accordingly, one embodiment of printed circuit board 304 is preferably arranged to take advantage of such ground vias. For example, shielded connectors 312 and corresponding ground moats 402 can be mounted on opposing sides of printed wiring board 202. Alternatively, ground pads 502 or a combination of ground moats 402, ground pads 502, ground strips or other combinations of ground lands can be disposed on opposing sides of printed wiring board 202.

It should be understood that the location, quantity and distribution of ground lands in general, and ground moats 402 and ground pads 502 specifically, can vary significantly depending on a number of well-known factors and features of printed circuit board 304. For example, the quantity of signal leads that come onto or off of printed wiring board 202, the frequency of the signals traveling on the signal leads. In addition, the resulting electromagnetic fields that are generated by the signals, which is based on the type of lead and connector as well as the signal characteristics will also determine the grounding scheme implemented. Referring to FIG. 3, for example, ground moat 402 may be located at various locations on printed circuit board 304, depending on the type of signals and components implemented. For example, ground moat 402 can be mounted on bottom surface 326 of printed wiring board 202 around the location at which I/O leads 320 enter printed wiring board 202.

D. Electrically Connecting EMI Shielded Regions

As noted, conformal EMI shield 100 can be applied to predetermined regions or portions of printed circuit board 304. Referring to the exemplary embodiment illustrated in FIG. 3, conformal EMI shield 100 coats top surface 322 of printed circuit board 304. This coating is physically contiguous, surrounding such elements as metal cages 316, shielded connector 312 and power feed-through connector 308. Similarly, in the embodiment disclosed in FIG. 3, conformal EMI shield 100 also coats entirely bottom surface 326 of printed wiring board 202.

A potential can develop between the region(s) of conformal EMI shield 100 that coat top surface 322 and the region(s) of conformal EMI shield 100 that coat bottom surface 326. Should such a potential develop, the two regions of conformal EMI shield 100 can effectively form an RF antenna and, therefore, be a source of EMI. To prevent this from occurring, the top and bottom surface regions of conformal EMI shield 100 are preferably connected electrically to each other, directly or through a common ground. Thus, conformal EMI shield 100 is an electrically continuous coating that may or may not be physically contiguous over the surfaces of printed circuit board 304.

Figure 6A:
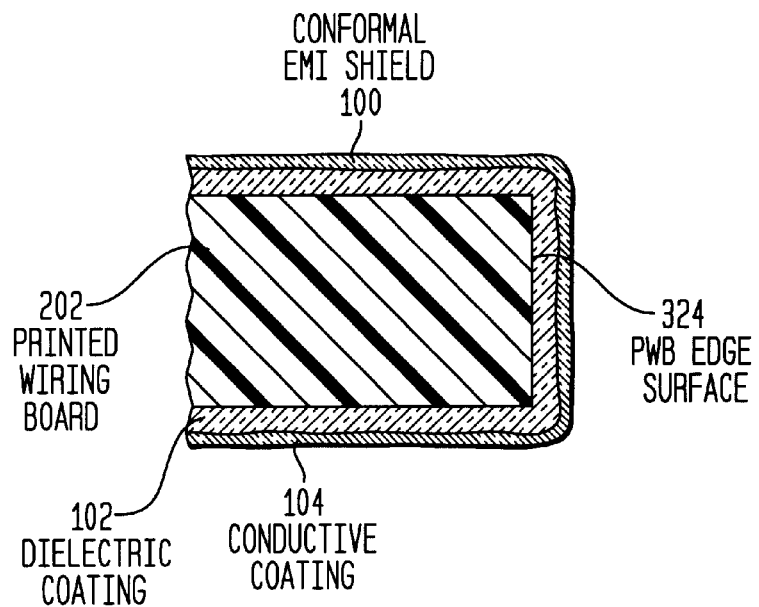
FIG. 6A is a cross-sectional view of an edge region of a printed wiring board showing a continuous conformal EMI shield of the present invention coating the top, edge and bottom surfaces of the printed wiring board.

In the embodiment illustrated in FIG. 6A, the two regions of conformal EMI shield 100 that coat the top and bottom surfaces of printed circuit board 202 are connected to each other through another region of conformal EMI shield 100 applied to edge surfaces 324 of printed wiring board 202. In other words, the three regions (top, edge and bottom coatings) can be considered a single region and printed circuit board 304 is coated continuously on the top, edges and bottom surfaces with conformal EMI shield 100. Thus, conformal EMI shield 100 is, in this embodiment, physically contiguous and electrically continuous.

Figure 6B:
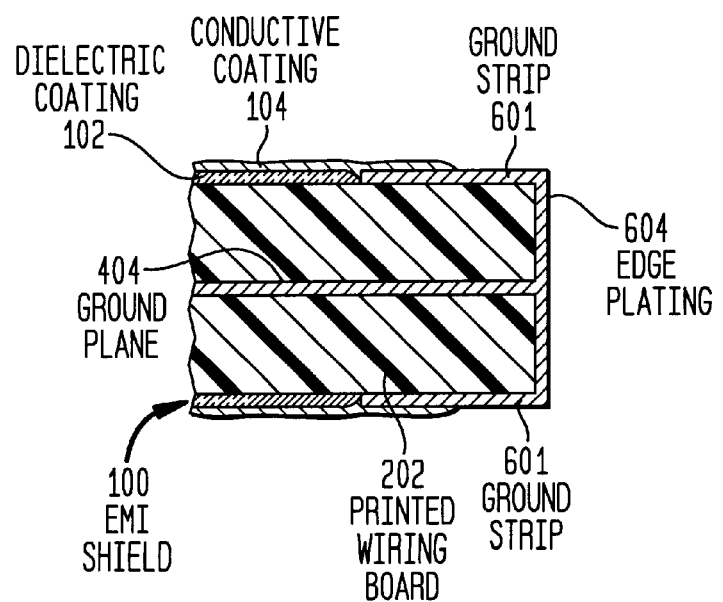
FIG. 6B is a cross-sectional view of an edge region of a printed wiring board showing the conformal EMI shield coating ground strips mounted on the top and bottom surface proximate to the edge surfaces on which a grounded edge plating is mounted.

Should it be impracticable or otherwise undesirable to apply conformal EMI shield 100 to edges 324 of board 202, then alternative arrangements can be implemented to provide electrical continuity between all regions of conformal EMI shield 100. For example, in an alternative embodiment shown in FIG. 6B, printed wiring board 202 can be made with plated edges. Edges 324 of board 202 are preferably plated with the same material as the material utilized in ground plane 404, such as copper. The top and bottom regions of conformal EMI shield 100 are connected to edge plating 604 on each side of board 202. As shown in FIG. 6B, edge plating 604 wraps around printed wiring board 202 to form ground strips 601 which cover some distance or area on top and bottom surfaces 322, 326 thereof. As used herein, a ground strip 601 is an elongate ground pad.

Ground strips 601, edge plating 604 and ground plane 404 are connected physically and electrically. Dielectric coating 102 is applied to printed wiring board 202 so as to coat top and bottom surfaces 322, 326 of printed wiring board 202 and not ground strips 601. Conductive coating 104 is applied so as to coat dielectric coating 102 and at least a portion of ground strips 601, as shown in FIG. 6B. This provides an electrical connection between conductive coating 104 on the top and bottom surfaces 322, 326 to each other as well as to ground. Thus, in this alternative embodiment, conformal EMI shield 100 includes physically separate regions that are connected electrically through edge plating 604.

Figure 6C:
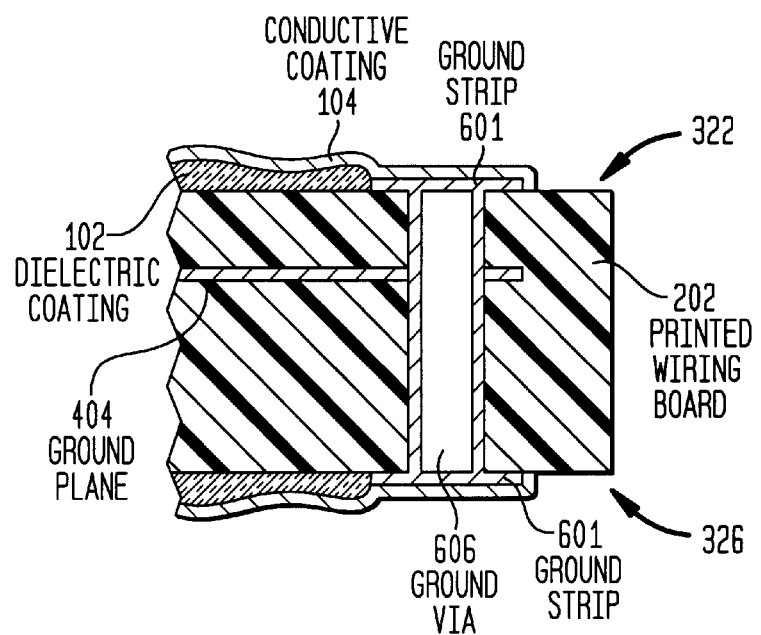
FIG. 6C is a cross-sectional view of an edge region of a printed wiring board showing the conformal EMI shield coating ground strips mounted on the top and bottom surface proximate to the edge surfaces with the ground strips connected to a ground plane through ground vias.

FIG. 6C is a cross-sectional view of an alternative approach to achieving electrical continuity between regions of conformal EMI shield 100. In this alternative embodiment, printed wiring board 202 is manufactured with rows of ground vias 606 and one or more ground strips 601 around its periphery. As noted, a ground strip 601 is an elongate ground pad. On each side 322, 326 of printed wiring board 202, the vias 606 are connected electrically to ground strips 601. As in the embodiment illustrated in FIG. 6B, dielectric coating 102 is applied to printed wiring board 202 so as to coat top and bottom surfaces 322, 326 of printed wiring board 202 while not coating ground strips 601. Conductive coating 104 is applied so as to coat dielectric coating 102 and at least a portion of ground strips 601. This connects electrically conductive coating 104 on the top and bottom surfaces 322, 326 to each other as well as to ground.

Figure 6D:
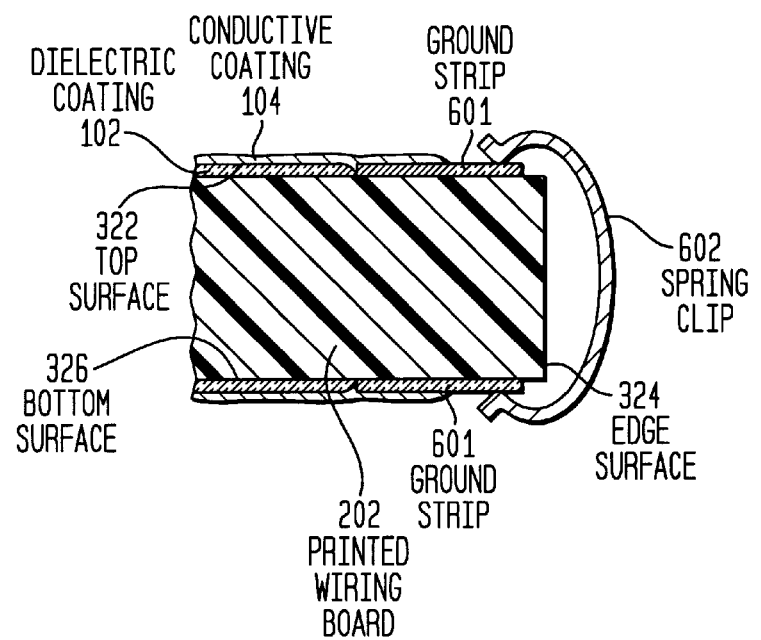
FIG. 6D is a cross-sectional view of an edge region of a printed wiring board showing the conformal EMI shield coating ground strips mounted on the top and bottom surface proximate to the edge surfaces with a spring clip electrically connecting the two ground moats.
Figure 6E:
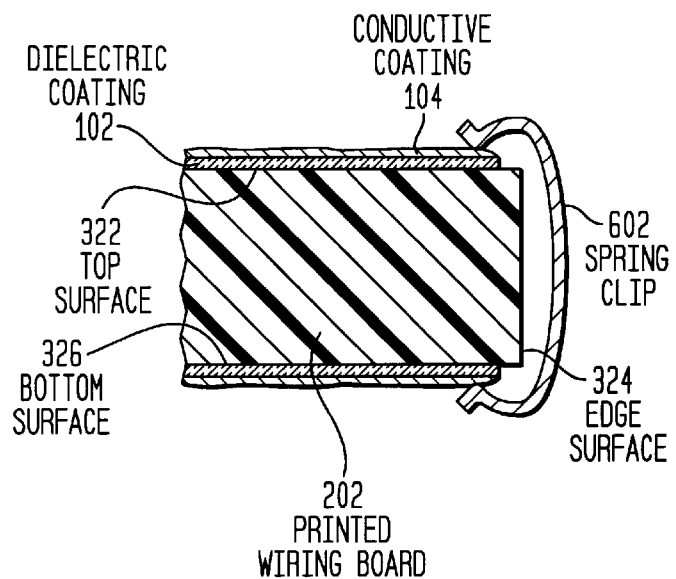
FIG. 6E is a cross-sectional view of an edge region of a printed wiring board showing the conformal EMI shield coating the top and bottom surfaces with a spring clip electrically connecting the two conformal EMI shield regions.

FIGS. 6D and 6E are cross-sectional views of an edge region of printed wiring board 202 showing different embodiments for connecting electrically regions of conformal EMI shield 100 that coat the top and bottom surfaces 322, 326 of printed wiring board 202 using spring clips. Specifically, in FIG. 6D ground strips 601 are mounted on top and bottom surfaces 322, 326 of printed wiring board 202 proximate to edge surfaces 324. One or more spring clips 602 are secured around edge 324 of printed wiring board 202 so as to contact ground strips 601 secured to opposing sides of printed wiring board 202. Sprint clip 602 is formed from an electrically conductive material, and is preferably a unitary device that can be installed manually. As with the other embodiments, dielectric coating 102 is applied to printed wiring board 202 so as to coat top and bottom surfaces 322, 326 of printed wiring board 202 while not coating ground strips 601. Conductive coating 104 is applied so as to coat dielectric coating 102 and at least a portion of ground strips 601. This connects electrically conductive coating 104 on the top and bottom surfaces 322, 326 to each other through spring clip 602. It should become apparent that each ground strips 601 has a size or length sufficient to enable spring clip 602 to attach securely thereto, without risk of inadvertent detachment.

In the embodiment illustrated in FIG. 6E, conformal EMI shield 100 coats the entire top and bottom surfaces 322, 326 in the vicinity proximate to edge surface 324. In such embodiments, ground strips 601 shown in FIG. 6D are eliminated, with spring clip 602 contacting directly conductive coating 104. As one of ordinary skill in the art would find apparent, other configurations may be implemented to connect electrically regions of conformal EMI shield 100 coating top and bottom surfaces 322, 326 of printed circuit board 304.

E. Design of Printed Wiring Board to Accommodate EMI Shield

Aspects of the present invention include a printed wiring board 202 constructed and arranged to operate with conformal EMI shield 100, as well as a printed circuit board 304 incorporating such a printed wiring board 202 and conformal EMI shield 100.

Printed wiring board 202 typically includes multiple layers each of which includes an insulator, commonly an epoxy glass, with signal traces and a ground plane formed on opposing surfaces thereon. Typically, traces internal to printed wiring board 202 are located between two ground planes with an intervening layer of insulating material. Signal traces that travel long the surface of the printed wiring board are positioned between a ground plane below, with an intervening layer of insulating material, and air above.

The characteristic impedance of the signal traces is a function of the width and thickness of the trace, the distance between the trace and surrounding ground plane(s), and the dielectric properties of the intervening insulating material. The characteristic impedance in turn effects the electrical properties of the traces such as the velocity of propagation.

The greatest contributor to the characteristic impedance of a signal trace is the parasitic capacitance established between the signal trace and its neighboring traces. Since internal traces have a ground plane located above and below it while a surface trace has a single ground plane located below it, the parasitic capacitance of the internal trace is approximately twice that of surface traces, with a concomitant reduction in characteristic impedance.

This is not the case for printed circuit boards of the present invention. Coating a printed wiring board 202 with conformal EMI shield 100 will significantly increase the parasitic capacitance of the surface traces, decreasing the characteristic impedance of the surface traces. The change in the characteristic impedance is, as noted, a function of the cross-section of the surface trace, the distance between the surface trace and conductive coating 104 and the dielectric properties of dielectric coating 102.

Thus, in accordance with aspects of the present invention, printed wiring board 202 and conformal EMI shield 100 are configured to control electrical characteristics of surface traces by adjusting such features. For example, the width and thickness of the surface traces as well as the dielectric constant and thickness of dielectric coating 104 can be adjusted to achieve desired electrical characteristics such as characteristic impedance. In an alternative embodiment, printed circuit board 102 can be configured with no traces on the outer board layers.

In addition, a printed wiring board 202 of the present invention includes ground moats 402 mounted around connectors that may carry high frequency signals, as described above, and, preferably, ground lands periodically mounted throughout printed wiring board 202.

4. Individual Components Coated with Conformal EMI Shield

Repair of printed circuit boards 304 coated with conformal EMI shield 100 is likely to be difficult and expensive. The ideal solution would be to coat mainly the inexpensive parts of printed circuit board 304, such that it would be economical to merely discard failed or defective boards, salvaging the expensive processors, etc. for reuse. However, such components would lack the appropriate shielding. Aspects of the present invention provide a technique for coating such components with conformal EMI shield 100 while enabling the components or subassemblies to be removable for repair, replacement or salvage.

Figure 7:
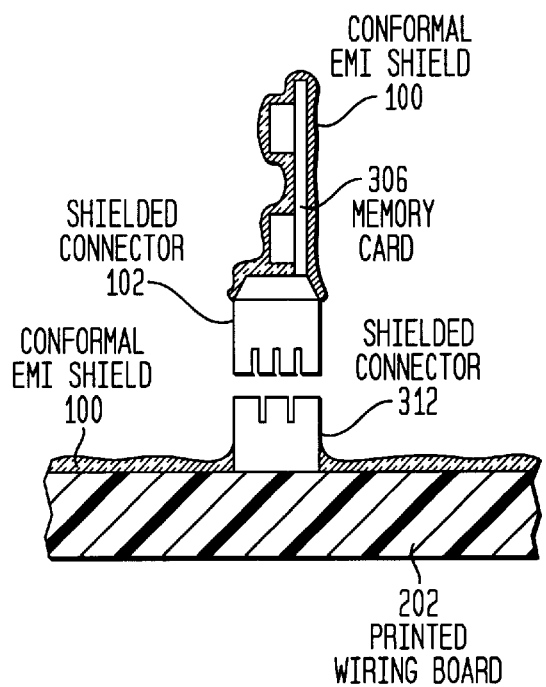
FIG. 7 is a custom memory card coated with the conformal EMI shield in accordance with one embodiment of the present invention.

FIG. 7 is a cross-sectional view of an exemplary embodiment of a removable component, memory card 306, coated with conformal EMI shield 100. In this exemplary embodiment, a workstation or desk top computer provides the capability to be configured more or less memory as needed for the computer's particular application. To accomplish this, a printed circuit board with memory sockets to receive various combinations of memory cards is included in the device. Such memory cards can be plugged into the socket and shielded with conformal EMI shield 100 with the other components 302 on printed circuit board 304. Alternatively, such a memory card can be shielded with a conventional metal cage 316. As shown in FIG. 3, when such a conventional metal cage is utilized, the cage is connected to conformal EMI shield 100 through, for example, gaskets or flanges that are bonded to conformal EMI shield 100.

In accordance with another aspect of the invention, memory card 306 can be coated individually; that is, conformal EMI shield 100 can be applied to memory card 306 prior to it being installed in printed circuit board 304. Embodiments of such aspects of the invention include a mechanism to electrically connect conformal EMI shield 100 coating memory card 306 with conformal EMI shield 100 coating printed wiring board 202. In the embodiments shown in FIG. 7, such an electrical connection is achieved through the use of mating shielded connectors 702 and 312. As shown, connector 312 is physically and electrically connected to conformal EMI shield 100 applied to printed wiring board 202.

Most computers need to accommodate accessory cards from various vendors that add special capabilities. Examples include cards that provide the interface to a particular LAN protocol, or a high-speed data interface. In one embodiment, the devices have special features to interface with conformal EMI shield 100. In a more preferred embodiment, the devices are individually coated with conformal EMI shield 100, as described above. In further embodiments, a local shielding enclosure 316 such as a metal enclosure with appropriate removable covers for installation of the accessory cards can be used. The interface between the shielding of the metal enclosure and the coated board would be as described above in connection with hybrid shielding arrangements, such as gaskets between the enclosure and ground strips 603 on printed wiring board 202.

5. A Low Profile Component Cover for Encasing Components

In certain aspects, the invention includes a pre-manufactured non-electrically conductive component cover. Generally, the component cover is configured for placement over a printed circuit board component and secured to the printed wiring board. The component cover and printed wiring board surround the component, forming an enclosure referred to as a component compartment. The component cover has a substantially thin cross-section and an interior surface that follows closely the surface of the component, thereby minimizing the volume enclosed by the component cover. In addition, the interior surface of the component cover is immediately adjacent to the component so as not to add significantly to the dimensions of the printed circuit board. As such, the component cover has a low profile and prevents the subsequently applied conformal EMI shield from physically contacting the encased component. Instead, the exterior surface of the component cover is coated with the EMI shield. This provides the significant benefits of the conformal EMI shield while providing access to the compartmentalized component. This enables the covered component to be removed from the printed circuit board for repair, replacement or salvage without having to risk damage to the printed wiring board or component that may occur with the removal of a conformal EMI shield applied directly to the component.

Specifically, it may be required or desired to access certain components 302 mounted on printed wiring board 202. For example, during the operational life of printed circuit board 304, it may be desired to access a component 302 for troubleshooting, repair or replacement. Also, it may be desired to salvage a component 302 at the end of the operational life of printed circuit board 304. Such components 302 may include, for example, expensive or rare components.

As noted, conformal EMI shield 100 completely coats those surfaces to which it is applied. Removal from printed wiring board 202 of a component 302 coated with conformal EMI shield 100 requires that shield 100 be severed at those locations where the component is connected or adjacent to printed wiring board 202. For example, referring to FIG. 2C, this may include the boundaries between printed wiring board 202 and integrated circuit body 206 and leads 208.

There are a number of currently available techniques that could be used to sever conformal EMI shield 100. One such conventional approach is to chemically etch or otherwise dissolve conformal EMI shield 100. Unfortunately, such treatments typically include the use of chemicals that are sufficiently active not only to penetrate conformal EMI shield 100, but to also damage the coated components 302. In addition, the accuracy of the application is limited, making it difficult to precisely apply the chemicals to remove specific areas of conformal EMI shield 100. As a result, severing conformal EMI shield 100 at component-board boundaries around, for example, component leads, would be inefficient.

Another conventional technique that could be used to sever conformal EMI shield 100 is referred to as sandblasting or, more particularly, as bead blasting. However, such an approach also lacks precision and risks damage to the coated component 302, particularly fragile components. Furthermore, even if components 302 can be successfully removed from printed wiring board 202, all surfaces of component 302 including its body and leads, will be coated with conformal EMI shield 100, as noted above. This may interfere with the intended activities or future use of the component.

There are two options currently available to avoid such drawbacks of traditional approaches. One approach is to not coat fragile and expensive components 302 with conformal EMI shield 100, in which case the component would not be shielded. An alternative approach is to contain the component 302 within a conventional metallic cage 316, in which case it will suffer from the drawbacks noted above. Aspects of the present invention described below overcome the above and other drawbacks of chemical etching and bead blasting while not preventing the use and attendant benefits of conformal EMI shield 100.

In one aspect of the invention, a pre-manufactured, non-electrically-conductive, low profile component cover is secured to printed wiring board 202, forming a sealed compartment dimensioned to encase component 302. Conformal EMI shield 100 can then be applied to the exterior surface of the component cover in the manner described above. Since the component cover has a low profile, the covered component 302 experiences the same benefits of conformal EMI shield 100 as if covered directly with conformal EMI shield 100. Here, however, conformal EMI shield 100 will not interfere with future uses of the covered component. At least a portion of the cover, along with conformal EMI shield 100 attached thereto, can be easily removed from printed circuit board 304 to expose component 302. Component 302 is thereafter accessible, and can be tested or removed from printed wiring board 202 using conventional techniques. In sum, components enclosed in a component compartment of this aspect of the invention are accessible while enjoying the many advantages of conformal EMI shield 100.

Figure 8A:
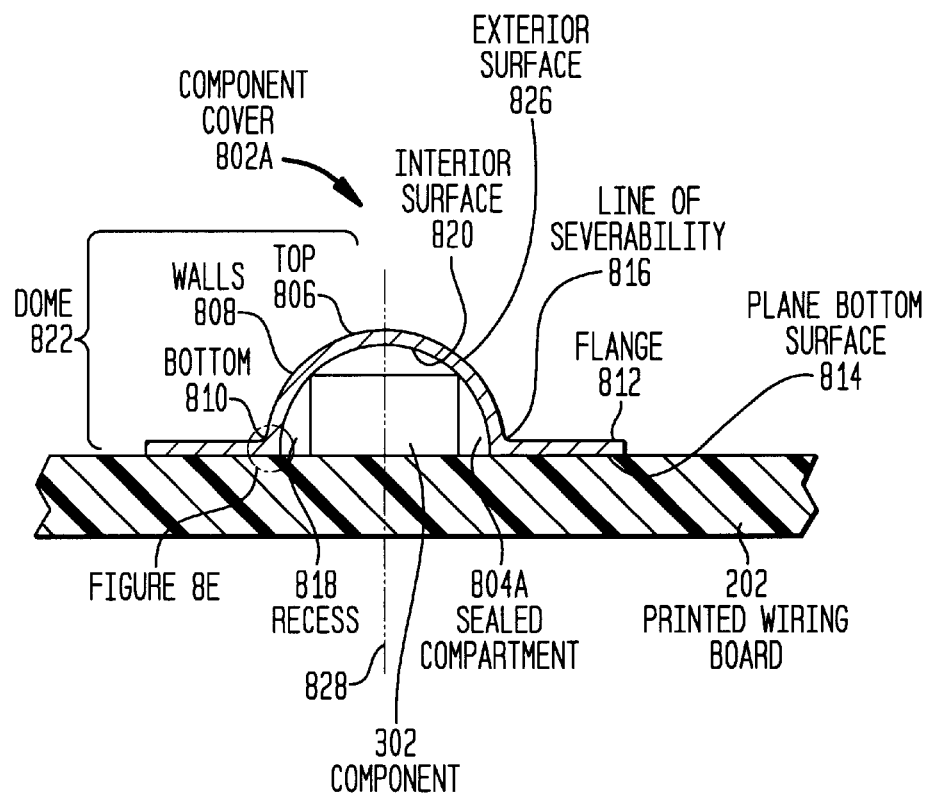
FIG. 8A is a cross-sectional view of a printed wiring board with a component mounted thereon with a nonconductive component cover mounted over the component to encase the component in a compartment defined by the cover and the printed wiring board.

FIG. 8A is a cross-sectional view of one embodiment of a component 302 disposed in a sealed component compartment 804A formed by placing a non-electrically-conductive, low profile component cover 802A over component 302, and securing component cover 802A to printed wiring board 202. Component cover 802A in FIG. 8A has a surface of rotation about a vertical axis 828, defining, in this embodiment, a symmetrical half-sphere. In an alternative embodiment shown in FIGS. 8B–8D a more arbitrarily shaped component cover 802B is shown. There, component cover 802B forms with printed wiring board 202 an arbitrarily-shaped component compartment 804B for a processor integrated circuit 850.

In the embodiment illustrated in FIG. 8A, nonconductive component cover 802A is preferably a pre-manufactured cover with a dome 822 configured to envelop a selected component 302, and a flange 812 configured to be secured to printed wiring board 202. Dome 822 has a closed top 806, an open bottom 810 remote from top 806, and walls 808 extending between closed top 806 and open bottom 810, forming a recess 818 suitable for receiving component 302. Flange 812 surrounds open bottom of dome 822 and has a generally planar bottom surface 814 to mate with printed wiring board 202. When attached to printed wiring board 202, component cover 802A and printed wiring board 202 form component compartment 804A. Component cover 802A can be unitary, or dome 822 and flange 812 are separately manufactured pieces that are attached to each other to firm an integral cover. Dome 822 and flange 812 can be detachably or permanently connected using an appropriate non-electrically-conductive adhesive.

Component cover 802A is sealed to printed wiring board 202. Preferably, the junction between component cover 802A and printed wiring board 202 are sealed so as to prevent dielectric coating 102 from penetrating component compartment 804A. Preferably, component compartment 804A is evacuated and sealed to remove moisture from compartment 804A and prevent corrosion of component 302. Any commonly known technique can be used to create a vacuum in compartment 804A. For example, the same technique as that commonly used to mount an integrated circuit can on a printed wiring board can be used.

As noted, one important feature of component cover 802A is that it not prevent access to covered component 302. In one embodiment, component cover 802A is sufficiently thin and formed from a material that can be manually cut. In an alternative embodiment illustrated in FIG. 8A, a line of severability 816 traverses component cover 802A at the boundary between dome 822 and flange 812. Preferably, line of severability 816 is a line of weakening that facilitates the severing of dome 822 from flange 812, leaving flange 812 secured to printed wiring board 202. In one embodiment, line of severability 812 is a crease, fold line or other weakened form. FIG. 8E shows two embodiments of a crease line 824. In FIGS. 8E-1, crease 824A is v-shaped groove pointing towards the interior corner formed by flange 812 and wall 808. In FIGS. 8E-2, crease 824B is laterally directed across wall 808. Such embodiments substantially reduce the thickness of component cover 802A at that location, facilitating severing of the portion of the cover traversed by the line of severability, here, dome 822. Such severing may be achieved by scoring conformal EMI shield 100 (not shown) and cover 802A. In certain embodiments, the material, wall thickness and depth of crease 824 may be sufficient to enable a technician to score conformal EMI shield 100 and sever dome 822 manually.

It should be understood that the location and type of line of severability 816 can be selected for a given application. For example, the noted embodiments of line of severability 816 do not provide an opening into compartment 804A. Such embodiments enable compartment 804A to be evacuated, as noted above. However, should component 302 not be subject to corrosion or otherwise benefit from such an evacuation, then line of severability 816 could be implemented as a line of perforations or other embodiment which partially penetrates the walls 808 of dome 822.

Returning to FIG. 8A, in an alternative embodiment, dome 822 of component cover 802A is pressure-rupturable. When walls 808 are subjected to a manual force applied radially inward, dome 822 ruptures and is severed along line of severability 816. In such embodiments, the interior surface 820 of dome 822 would not touch the component 302 as shown in FIG. 8A; rather, a space sufficient to enable the ruptured dome 822 to separate from flange 812 would be provided. Thus, in such an embodiment, to expose component 302, conformal EMI shield 100 is cut at the junction between dome 822 and flange 812. In those embodiments in which line of severability is a crease, the crease can guide the point of a knife or other cutting instrument. Manual force is then applied to walls 808 adjacent to flange 812, severing dome 822 from flange 812. Dome 822 is thereafter removed to expose component 302.

Preferably, recess 818 is dimensioned to receive component 302 with minimal space between the interior surface 820 of dome 822 and component 302 when component cover 802A is secured to printed wiring board 202. This, in conjunction with the relatively thin top 806, walls 808 and flange 812, results in a component compartment 804A having a minimal profile. In other words, the volume of compartment 804A in not substantially greater than the volume defined by the surfaces of component 302.

An important feature of component cover 802A is that it have a shape suitable for receiving dielectric coating 102 and, ultimately, conductive coating 104, while providing this minimal profile. As such, the exterior surface 826 of component cover 802A is preferably without sharp edges, indentations, or other abrupt changes. Thus, dome 822 can take on virtually any shape beyond the symmetrical half-sphere shape illustrated in FIG. 8A. For example, dome 822 can be disk-shaped, elliptical, rectangular and the like.

Figure 8B:
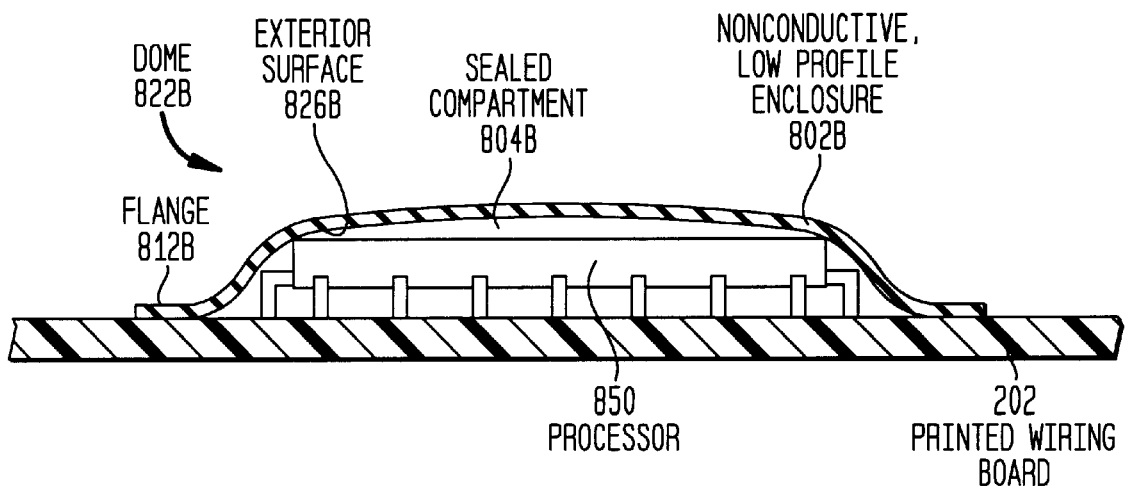
FIG. 8B is a cross-sectional view of a printed wiring board with a processor mounted thereon with a nonconductive, conformal cover with a contoured, arbitrary shape mounted over the processor to encase the processor in a compartment defined by the cover and the printed wiring board.
Figure 8C:
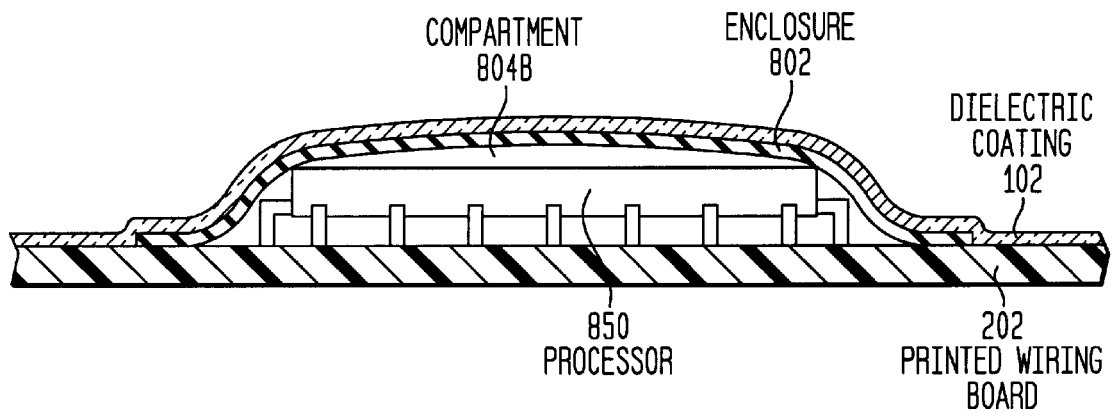
FIG. 8C is a cross-sectional view of the printed wiring board and component compartment shown in FIG. 8B with a dielectric coating of the present invention covering the surface of the component cover and surrounding printed wiring board.
Figure 8D:
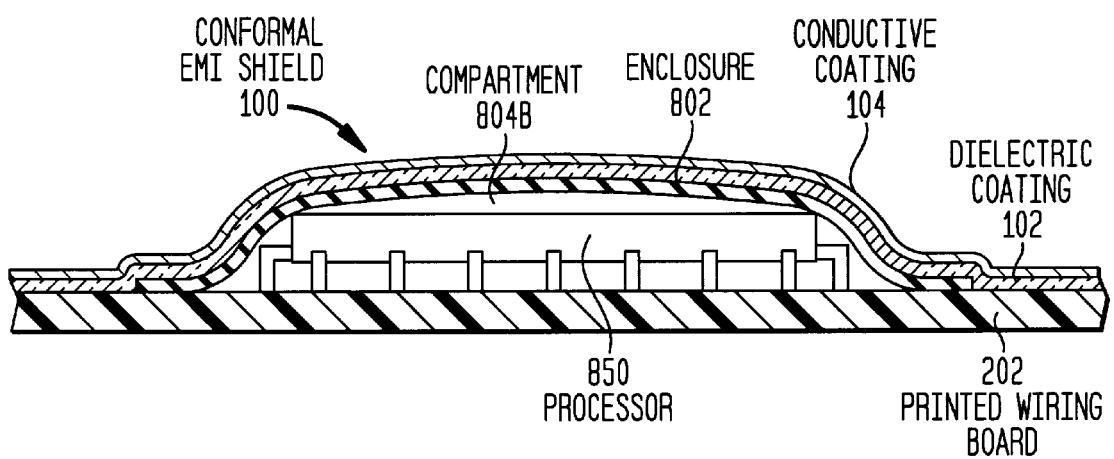
FIG. 8D is a cross-sectional view of the printed wiring board and component compartment shown in FIG. 8C with a conductive coating of the present invention covering the dielectric coating, forming conformal EMI shield of the present invention.
Figures 1, 8E:
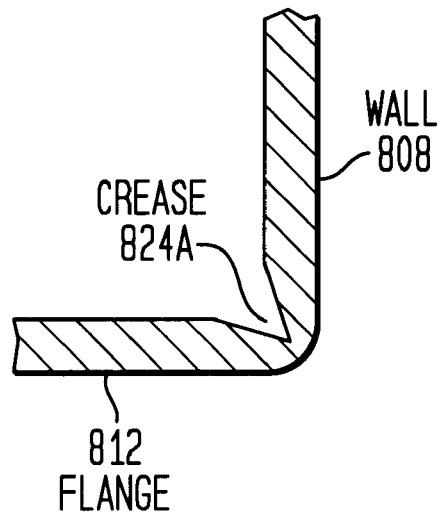
FIG. 8E includes two figures, FIGS. 8E-1 and 8E-2.
Figures 2, 8E:
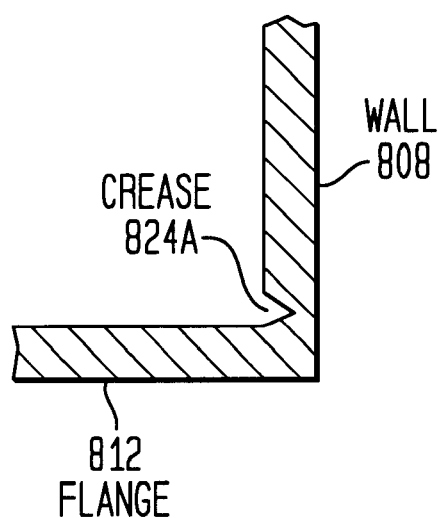

In another embodiment illustrated in FIGS. 8B–8D, a component cover 802B has a contoured, arbitrary shape. FIG. 8B is a cross-sectional view of component cover 802B dimensioned to cover a processor IC 850. FIG. 8C is a cross-sectional view of component cover 802B with a dielectric coating 102 covering the exterior surface thereof, while FIG. 8D is a same view showing a conductive coating 104 covering dielectric coating 102 forming conformal EMI shield 100 of the present invention.

Referring to FIG. 8B, there is no distinctive boundary between dome 822B and flange 812B due to the contoured shape. A line of severability (not shown) can be formed in component cover 802B at any location above where flange 812B is attached to printed wiring board 202.

Referring to FIG. 8C, dielectric coating 102 is applied to the surface of printed wiring board 202 and exterior surface 826B of nonconductive conformal cover 802B. Similarly, as shown in FIG. 8D, conductive coating 104 is applied so as to cover entirely dielectric coating 104 applied previously to cover 802B.

Component cover 802 is, as noted, pre-manufactured with dimensions suitable for covering completely a particular component 302. Component cover 802 can be formed, folded or molded using any well-known technique suitable for the material used and intended application. With regard to materials, component cover 802 can be manufactured using any combination of non-conductive materials. For example, component cover 802 can be formed of polyethylene terephthalate (PETE), polyphenylsulfone (PPS) or RTV silicone rubbers, and polymers and synthetic rubbers such as TEFLON and VITON, among others. (TEFLON and VITON are registered trademarks of E. I. Du Pont de Nemours and Company.)

In alternative embodiments, component cover 802 is configured to provide access to component 302 without severing component cover 802. For example, in one alternative embodiment, component cover 802 is formed with an aperture at top 806 and includes in combination a cover, beveled insert or the like that can be removeably inserted into the aperture. To gain access to component 302, conformal EMI shield 100 around the beveled insert is scored and the insert removed. When component cover 802 is to be subsequently shielded, the beveled insert is reintroduced into the aperture and conformal EMI shield 100 is reapplied to component cover 802.

Thus, the low profile, non-electrically conductive component covers 802 enable components 302 to be shielded with conformal EMI shield 100 located at a location immediately adjacent to the components, in the near or induction field. In addition, component cover 802 does not provide any EMI shielding function, enabling a myriad of materials and manufacturing techniques to be used make such covers.

Figure 11:
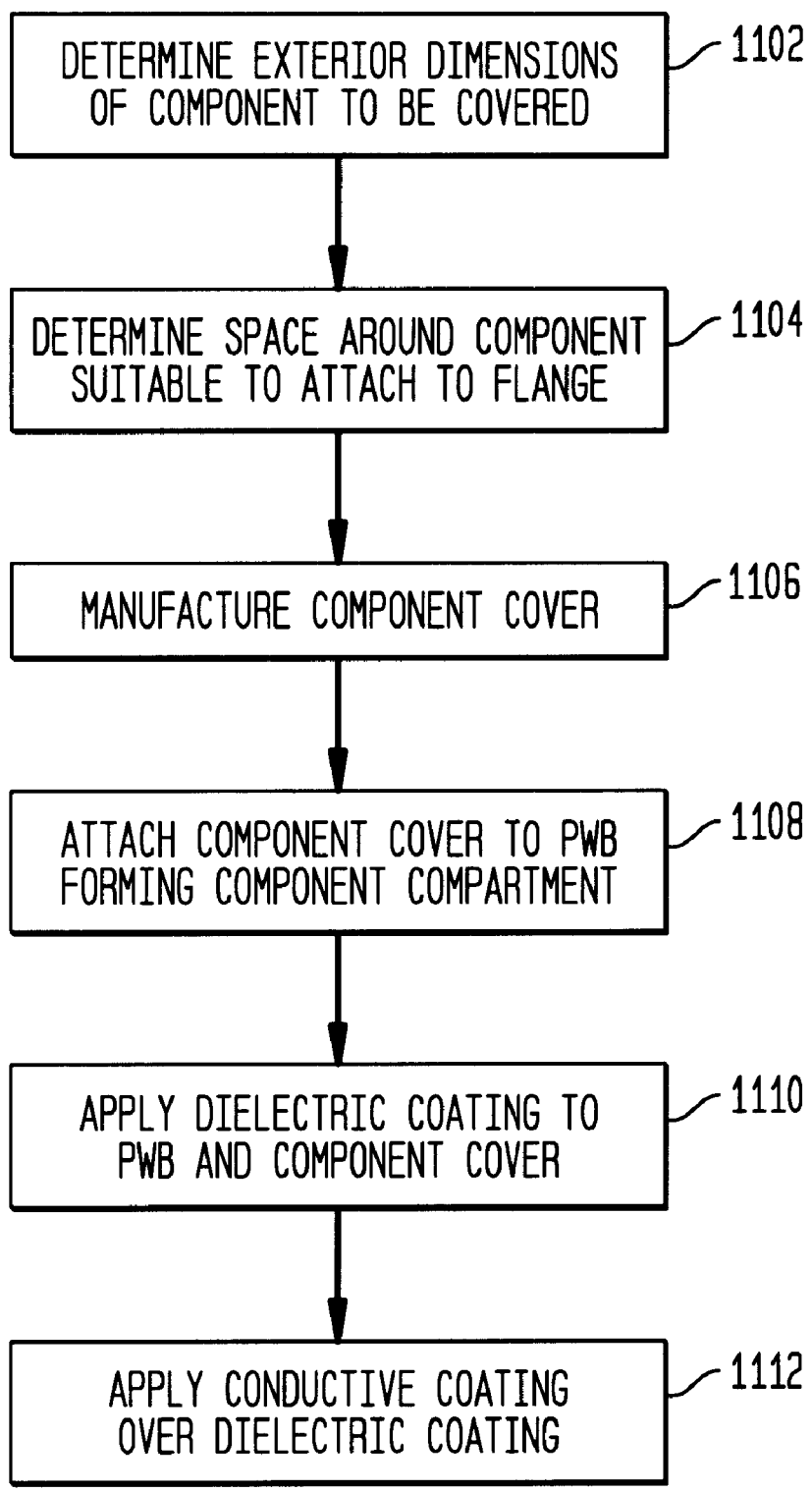
FIG. 11 is a flow chart of the primary operations performed in utilizing a component cover shown in FIGS. 8A–8E with the conformal EMI shield introduced in FIG. 1.

FIG. 11 is a flow chart of the primary operations performed in utilizing a component cover shown in FIGS. 8A–8E with conformal EMI shield of the present invention. At block 1102 the exterior dimensions of the component is determined. This includes all features of the component, including leads, heat sinks, etc. this information is used to determine the shape and size of dome 822 of component cover 802. Similarly, to determine the appropriate dimensions of flange 812, the space around the component is measured at block 1104. From this measurement, the size and shape of flange 812, including the configuration of bottom surface 814 are determined.

At block 1106 the component cover 802 is manufactured based on the dimensions determined at blocks 1102 and 1104. Alternatively, component 302 and component cover 802 can be specified prior to the manufacturing of printed wiring board 202. In such embodiments, printed wiring board 202 is manufactured to accommodate flange 812 of component cover 802.

The component compartment 804 is formed at block 1108. Here, component cover 802 is attached to printed wiring board 202 to form component compartment 804 dimensioned to encase component 302. Component compartment 804 is preferably evacuated or filled with a suitable inert atmosphere and sealed to maintain the environment at least until dielectric coating 102 is applied to component cover 802.

Conformal EMI shield 100 is applied at blocks 1110 and 1112. At block 1110, dielectric coating 102 is applied to printed wiring board 202 and the exterior surface of component cover 802. The manner in which dielectric coating 102 is applied is described elsewhere herein. As noted, dielectric coating 102 can be applied in many layers each bonded with its neighboring layers to form dielectric coating 102. At block 1112, conductive coating 104 is applied to the surface of dielectric coating 102. Each step 1110 and 1112 includes a number of subsidiary steps to prepare the surface, cure the coating, etc. This is described in greater detail above. Thus, upon the completion of the operations noted in block 1112, a conformal EMI shield 100 is applied to the component 302 contained in the component compartment. Since the component compartment is constructed and arranged to have a low profile, it defines a volume not substantially different than the volume defined by the surface of the covered component. As a result, conformal EMI shield 100 remains in the induction region immediately adjacent to component 302.

6. Filler Material for Use With Board-Level Containment of Electromagnetic Emissions Aspects of the conformal EMI shield of the present invention can include a high viscosity, non-electrically-conductive filler material for application to printed circuit board regions that have surfaces that are cavitatious and/or which have sharp edges or other highly variable surface tangent slopes. The filler material and associated methodologies of the present invention are preferably used in conjunction with conformal EMI shield 100. The high viscosity, electrically non-conductive filler material substantially covers, and preferably infills, each cavity such that the covered cavity is thereafter inaccessible. The filler material also coats the sharp edges on the printed circuit board. Thus, the pretreated portions of the printed circuit board regions have a contiguous, contoured surface that facilitates the coating of the printed circuit board regions with conformal EMI shield 100.

Specifically, there are small gaps or spaces between component leads, neighboring components and between components 302 and printed wiring board 202 that are relatively small. These various spaces are referred to herein generally and collectively as "cavities." Such cavities may have more than one opening on the surface of the printed wiring board that exposes the cavity. For example, the space between the leads of a component and the component body and printed wiring board is considered to be a cavity. Such a cavity has an opening to the surface of the printed circuit board between neighboring leads. Significantly, dielectric coating 102 has a combination of properties that enables it to penetrate or access such cavities. Dielectric coating 102 attaches to the component and printed wiring board surfaces forming such cavities when applied via air atomizing techniques, as described above.

Figure 9A:
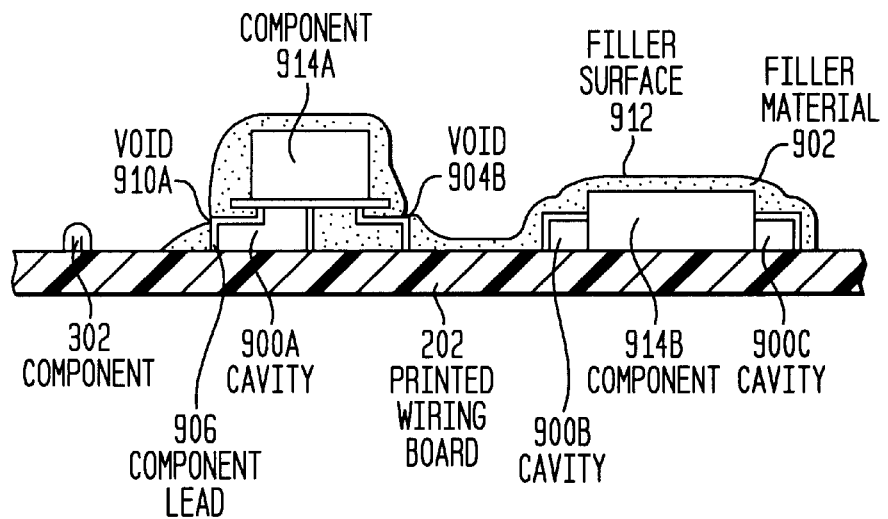
FIG. 9A is a cross-sectional view of a printed circuit board with a filler material applied to certain regions thereof in accordance with one embodiment of the invention to cover, encapsulate enclose or otherwise coat cavities on the printed circuit board, such as between the components and printed wiring board.

Although dielectric coating 102 sufficiently coats the component and board surfaces that define cavities, such surfaces are the more difficult surfaces to coat with conformal EMI shield 100. In one aspect of the invention, a non-electrically-conductive, high viscosity material is applied to specific regions of printed circuit board 304 to facilitate the coating of cavities on the printed circuit board. This aspect of the invention will be described with reference to FIGS. 9A–9D. FIG. 9A is a cross-sectional view of two components 302 mounted on a printed wiring board 202. In this example, one cavity 900A is located below the bottom surface of raised component 914A while two additional cavities are beneath the leads 906 of component 914B.

Those components or groups of components 914 that have or form such cavities 900 with each other and/or printed wiring board 202 are covered at least partially with a viscous, non-electrically-conductive filler material 902. Filler material 902 bridges across the opening(s) of each cavity 900 to cover, enclose, encapsulate and seal the cavity. Oftentimes, the cavities 900 are also at least partially infilled with filler material 902. Referring to the exemplary application shown in FIG. 9A, for example, cavities 900A and 900B are infilled while cavity 900C is not. Regardless of whether a cavity 900 is infilled, however, a coating of filler material 902 eliminates the requirement that dielectric coating 102 penetrate cavities 900 to coat component and board surfaces defining the cavity 900. In addition, filler material 902 can also be applied to highly variable surfaces of printed circuit board 304. Highly variable surfaces include surfaces having a surface tangent that experiences substantial changes in value and/or abrupt changes in sign over small regions.

Selective applications of filler material 902 converts the irregular and cratered printed circuit board surface to a contiguous surface having gradual transitions due to the covering of cavities and the smoothing of sharp and abrupt surfaces. In other words, a printed circuit board 304 having filler material 902 applied thereto has a surface tangent that does not change abruptly and which does not have cavities. Dielectric coating 102, when applied to components covered with filler material 902 will coat completely such components due to the contiguous, contoured surface provided by filler material surface 912. Thus, filler material 902 insures the successful insulation of printed circuit board 304 prior to the application of conductive coating 104.

Although the viscosity can vary, filler material 902 is preferably thixotropic, enabling it to be extruded into and over cavities 900 while covering the top, side and other surfaces of components 914. In one embodiment, filler material 902 is an epoxy such as any epoxy from the family of Bisphenol-A epoxies mixed with an amine hardner. In one particular embodiment, filler material 902 is an EMCAST, CHIPSHIELD, 3400 2500 and 3600 series epoxies available from Electronic Materials, Inc., Breckenridge, Colo. A thermally cured epoxy is preferred due to the inability to directly apply UV radiation to filler material 902 that is disposed in cavities 900 due to shadows cast by the components.

In another embodiment, a latex based non-electrically conductive coating, such as HumiSeal TS300 epoxy, sold under the tradename TEMPSEAL, available from HumiSeal, Woodside, N.Y. In contrast to the Bisphenol-A epoxies noted above, HumiSeal TS300 can be removed from printed circuit board 304 by manually peeling it from the component surfaces. In another embodiment, the epoxy ABLEBOND 9349K available from Tra-Con, Inc. is utilized as filler material 902. This epoxy is a gray, two-part epoxy manufactured with glass bead spacers to control the bond line thickness.

Figure 9B:
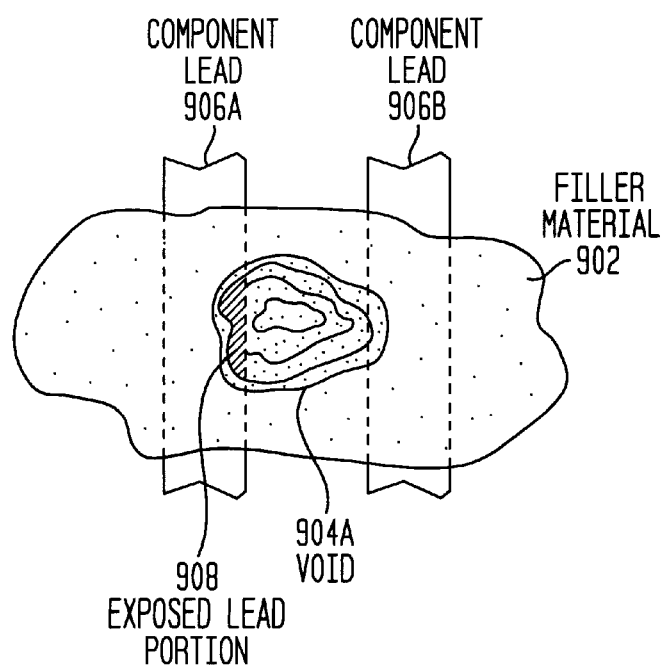
FIG. 9B is a top perspective view of a void formed in the filler material shown in FIG. 9A.
Figure 9C:
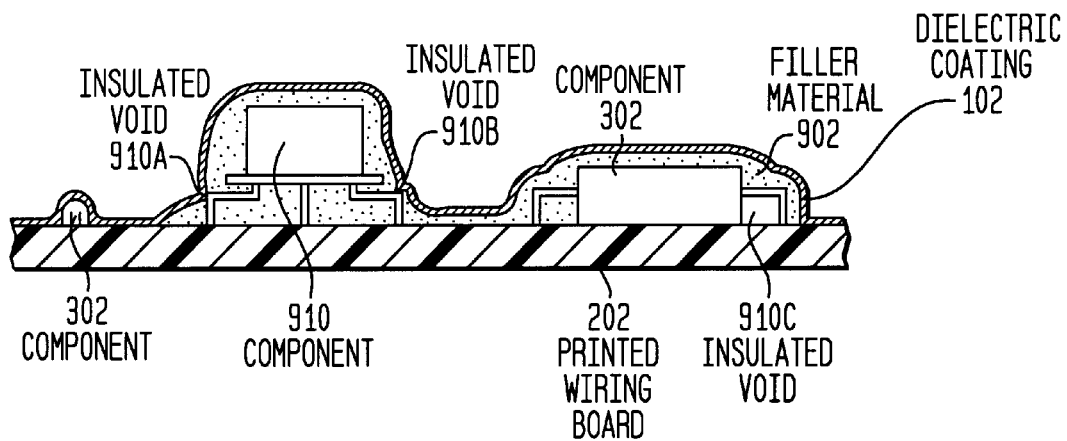
FIG. 9C is a cross-sectional view of a printed circuit board with the filler material applied thereto, as shown in FIG. 9A, with the dielectric coating of the present invention applied to the surface of the filler material and neighboring printed wiring board surfaces.
Figure 9D:
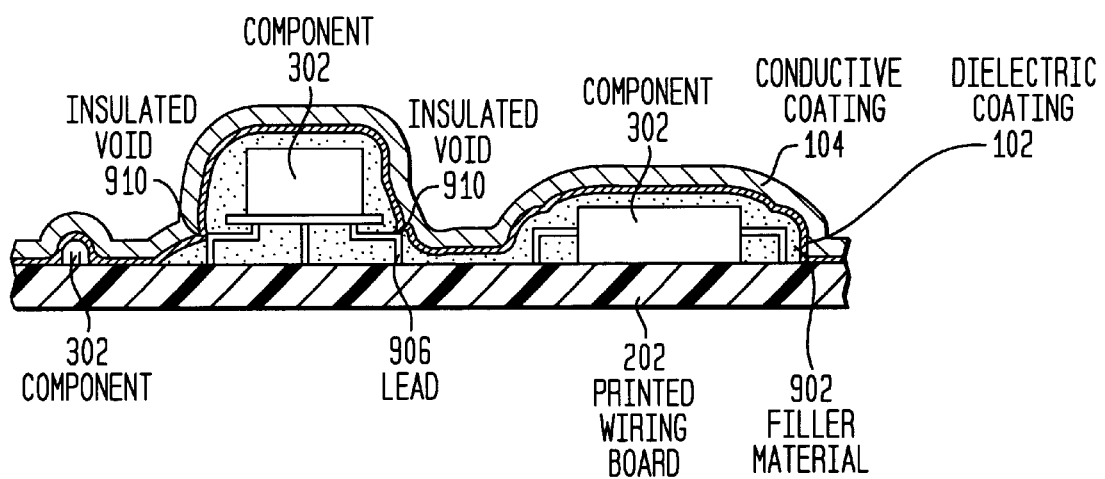
FIG. 9D is a cross-sectional view of the printed circuit board with a filler material and the dielectric coating applied thereto, as shown in FIG. 9C, with the conductive coating of the present invention applied to the surface of the dielectric coating to form the conformal EMI shield of the present invention.

It should be understood that due to variations in material, surface cavity configuration, application technique or a combination thereof, filler material 902 may cure with one or more voids. For example, referring to FIG. 9A, filler material 902 did not bridge completely across neighboring leads 906 in certain locations, forming voids 904A and 904B. FIG. 9B is a top view of void 904A. As shown, filler material 902 fills the cavity 900A between and below neighboring leads 906. Void 904A extends into the space between leads 906, exposing a portion 908 of lead 906A. If conductive coating 104 were to be applied to filler surface 912, void 904A would result in a short circuit of the exposed component lead 908. Thus, although such a circumstance can be eliminated through controlled processes, dielectric coating 102 is preferably applied to all surfaces of printed circuit board 304, including surface 912 of filler material 902. This insures that voids 904, if any, are completely insulated from the subsequently applied conductive coating 104. FIG. 9C is a cross-sectional view of the components shown in FIG. 9A, with a dielectric coating 104 applied to filler surface 912 of filler material 902 and the surface of printed wiring board 202. As shown in FIG. 9C, dielectric coating 104 completely covers surface 912 of filler material 902, including voids 904. As used herein, such voids, when coated with dielectric coating 104, are referred to as insulated voids 910. Application of conductive coating 104, as shown in FIG. 9D, results in a conformal EMI shield 100 that completely covers, while being electrically isolated from, printed circuit board 304.

It should be understood that the method for applying filler material 902 is a function of the selected material and specified by the manufacturer. Other operations may be included as well. For example, to avoid the formation of air pockets within or below the filler material 902 adjacent to components, the surface to be coated is subjected to negative pressure prior to the application of filler material 902. This eliminates the possibility of trapping air where it could corrode component surfaces. It should also be understood that multiple filler materials 902 can be incorporated into an EMI protected printed circuit board, for example, when different filler materials have different combinations of viscosity, thermal conduction and other properties each suitable for coating different components.

7. Manufacturing of Printed Circuit Board with Conformal EMI Shield

Figure 10:
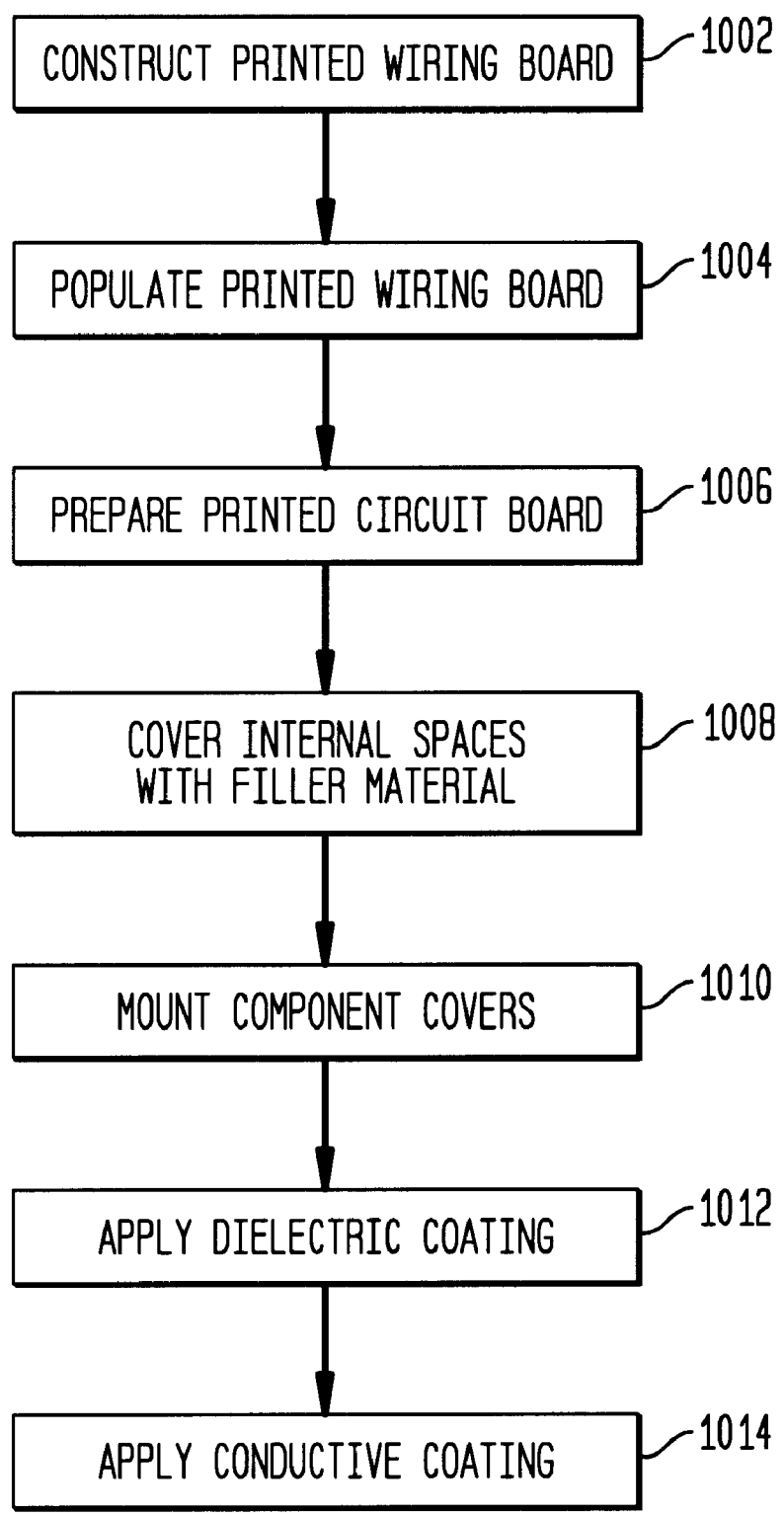
FIG. 10 is a flow chart of the operations performed to manufacture an EMI-shielded printed circuit board in which component covers and filler material are utilized with the conformal EMI shield in accordance with one embodiment of the present invention.

FIG. 10 is a flow chart of the primary operations performed in accordance with one embodiment of the present invention to form a printed circuit board with a conformal EMI shield coating at least a portion thereof. In the exemplary process 1000 that follows the printed circuit board is completely covered by conformal EMI shield 100.

Printed circuit board 304 is manufactured in steps or blocks 1002 and 1004. In block 1002 printed wiring board 202 is formed. Printed wiring board 202 may include surface traces designed to transfer signals while coated with conformal EMI shield 100. Further, printed wiring board 202 is constructed with ground pads in predetermined locations to be connected to conductive layer 104. Optionally, printed wiring board 202 may also include a series of ground vias located along the periphery of printed wiring board 202 to insure the electrical continuity of conformal EMI shield 100. At block 1004 printed wiring board 202 is populated with components to form one or more circuits, the sum of which is printed circuit board 304.

Printed circuit board 304 is then prepared for the application of conformal EMI shield 100 at block 1006. For example, soldering residues that may interfere with the ability of dielectric coating 104 to adhere to printed circuit board 304 are preferably washed off printed circuit board 304.

At block 1008 highly viscous filler material 902 is applied to predetermined components to fill and cover cavities thereof, as well as cavities between neighboring components and between components and printed wiring board 202. Filler material 902 may cover or encapsulate the component(s) or group of components. Filler material 902 can be applied using any well known extrusion technique that will not damage the covered components 302.

At block 1010 one or more component covers 802 are mounted on printed wiring board 202 to cover certain, predetermined components. As noted such components include those that are fragile or expensive and for which access need be provided without interference from conformal EMI shield 100.

Dielectric and conductive coatings 102, 104 are applied at blocks 1012 and 1014, respectively. One embodiment of the selected materials and associated application process, are described above. Both, dielectric coating 102 and conductive coating 104 are likely applied to predetermine regions of printed circuit board 304. This can be achieved by masking the printed circuit board 304 or by using a precision spray application technique, selectively applying coatings 304 to the desired regions of printed circuit board 304. For example, when masking is used, after dielectric coating 102 has cured, any masking unique to dielectric coating 102 is removed. Printed circuit board 304 is re-masked as necessary to prevent conductive coating 104 from shorting out connector contacts, etc. Thereafter, this masking is also removed from printed circuit board 304.

8. Closing

While various embodiments of the present invention have been described above, it should be understood that they have been presented by way of example only, and not limitation. For example, although air atomization spray techniques are commonly used, the present invention can be applied to printed circuit boards 304 using other gases such as nitrogen. As another example, it has been disclosed that conformal EMI shield 100 is preferably grounded, such as to ground plane 404 in printed wiring board 404. It should be appreciated, however, that conformal EMI shield 100 may need to be connected electrically to any reference voltage of which ground is only one. Thus, the breadth and scope of the present invention should not be limited by any of the above-described exemplary embodiments, but should be defined only in accordance with the following claims and their equivalents.

What is claimed is:

1. An electrically continuous conformal EMI protective shield for adhering directly to and conforming with surfaces of a printed circuit board comprising:

a thermally conductive dielectric coating adhering directly to surfaces of the printed circuit board and comprising an electrically nonconductive thermal loading material, thereby forming an electrically nonconductive, thermally conductive, contiguous layer over all such printed circuit board surfaces; and a conductive coating adhering directly to surfaces of the dielectric coating to provide an electrically conductive layer that prevents electromagnetic emissions from passing through the conformal EMI protective shield.

2. The conformal EMI shield of claim 1, wherein the thermal loading material comprises one or more of the group consisting of boron nitride (BN), aluminum oxide ($AlO_3$) and magnesium oxide (MgO).

3. The conformal EMI shield of claim 1, wherein the thermally conductive dielectric coating is formed from a thermally conductive dielectric dispersion comprising:

a base liquid;

a binder material suspended in the base liquid; and the electrically nonconductive thermal loading material suspended in the base liquid.

4. The conformal EMI shield of claim 3, wherein the thermal loading material comprises one of the group consisting of boron nitride (BN), aluminum oxide ($AlO_3$) and magnesium oxide (MgO).

5. The conformal EMI shield of claim 3, wherein the binder material comprises one of the group consisting of acrylic and urethane.

6. The conformal EMI shield of claim 3, wherein the base liquid and binder material are provided in an intermediate dispersion subsequently doped with the thermal loading material.

7. The conformal EMI shield of claim 3, wherein the base liquid is one of either water or an organic solvent.

8. The conformal EMI shield of claim 3, wherein the thermal loading material is 10%–80% and the binder is 90%–20% by weight of the thermally conductive dielectric dispersion.

9. The conformal EMI shield of claim 3, wherein the electrically nonconductive mal loading material comprises a 0.1–10 micron boron nitride powder.

10. The conformal EMI shield of claim 3, wherein the electrically nonconductive thermal loading material comprises a 100 mesh, 99% corundum, alpha-phase aluminum oxide powder.

11. The conformal EMI shield of claim 1, wherein the thermally conductive dielectric coating has a viscosity of at least 45" #2 Zahn Cup (full body).

12. The conformal EMI shield of claim 1, wherein the thermally conductive dielectric coating has a viscosity in the range of 50–100" #2 Zahn Cup (full body).

13. The conformal EMI shield of claim 1, wherein the thermally conductive dielectric coating has an adhesion that enables it to pass the ASTM D-3359-97 Method A Tape Test using a 1" (25 mm wide) semi-transparent pressure-sensitive tape with an adhesion strength of 25–70 ounces per inch when tested in accordance with ASTM Test Method D-3330.

14. The conformal EMI shield of claim 1, wherein the thermally conductive dielectric coating is 1.5–2.0 mils thick.

15. The conformal EMI shield of claim 1, wherein the thermally conductive dielectric coating is formed from multiple applications each forming a 1 mil thick layer of thermally conductive dielectric.

* * * * *

UNITED STATES PATENT AND TRADEMARK OFFICE
CERTIFICATE OF CORRECTION

PATENT NO. : 6,596,937 B2
DATED : July 22, 2003
INVENTOR(S) : Paul H. Mazurkiewicz It is certified that error appears in the above-identified patent and that said Letters Patent is hereby corrected as shown below:

<u>Column 36,</u>
Line 16, delete "mal" and insert therefor -- thermal --

Signed and Sealed this

Twenty-second Day of March, 2005

JON W. DUDAS
*Director of the United States Patent and Trademark Office*